United States Patent
Kuhara

(10) Patent No.: US 10,302,725 B2
(45) Date of Patent: May 28, 2019

(54) MRI APPARATUS THAT CONTINUOUSLY GENERATES AND COLLECTS MULTIPLE ECHO K-SPACE DATA FROM WHICH ODD AND/OR EVEN NUMBERED COLLECTED GROUPS OF K-SPACE DATA ARE EXTRACTED AND SEPARATELY PROCESSED

(71) Applicant: TOSHIBA MEDICAL SYSTEMS CORPORATION, Otawara-shi (JP)

(72) Inventor: Shigehide Kuhara, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 936 days.

(21) Appl. No.: 14/826,554

(22) Filed: Aug. 14, 2015

(65) Prior Publication Data

US 2015/0355303 A1    Dec. 10, 2015

Related U.S. Application Data

(63) Continuation of application No. PCT/JP2014/053954, filed on Feb. 19, 2014.

(30) Foreign Application Priority Data

Feb. 19, 2013   (JP) .................................. 2013-029957

(51) Int. Cl.
   *G01R 33/561* (2006.01)
   *G01R 33/385* (2006.01)
   *G01R 33/565* (2006.01)

(52) U.S. Cl.
   CPC ........ *G01R 33/5611* (2013.01); *G01R 33/385* (2013.01); *G01R 33/5616* (2013.01); *G01R 33/56554* (2013.01); *G01R 33/56563* (2013.01)

(58) Field of Classification Search
   CPC .............. G01R 33/5611; G01R 33/385; G01R 33/5616
   See application file for complete search history.

(56) References Cited

U.S. PATENT DOCUMENTS 6,265,872 B1 * 7/2001 Heid ................ G01R 33/56341
                                                              324/307
6,611,143 B2    8/2003 Kuhara
(Continued)

FOREIGN PATENT DOCUMENTS

| JP | 2001-327480 | 11/2001 |
| JP | 2009-273530 | 11/2009 |
| JP | 2011-136194 | 7/2011 |

OTHER PUBLICATIONS

S. Yun et al., "Ghost Artifact Reduction in EPI (Echo Planar Imaging) with Sensitivity Encoding (SENSE)", Proc. Intl. Soc. Mag. Reson. Med. 13, 2005, p. 2179.
(Continued)

*Primary Examiner* — Dixomara Vargas
(74) *Attorney, Agent, or Firm* — Nixon & Vanderhye P.C.

(57) ABSTRACT

A magnetic resonance imaging apparatus according to an embodiment includes sequence controlling circuitry and image generating circuitry. The sequence controlling circuitry is configured to continuously apply, after application of an excitation pulse, a readout gradient magnetic field while inverting polarity to control execution of a pulse sequence that continuously generates multiple echo signals and configured to collect echo signals for multiple channels by parallel imaging. The image generating circuitry is configured to extract at least one of an even-number-th collected echo signal group and an odd-number-th collected echo signal group from multiple echo signals continuously collected and configured to generate at least one of an even-number-th image and an odd-number-th image using the extracted echo signal group for the multiple channels and sensitivity distribution for the multiple channels.

12 Claims, 20 Drawing Sheets

(56) References Cited

U.S. PATENT DOCUMENTS

| | | | |
|---|---|---|---|
| 7,019,523 B2 * | 3/2006 | Ikezaki | G01R 33/5611 324/307 |
| 2002/0000805 A1 | 1/2002 | Kuhara | |
| 2004/0189299 A1 * | 9/2004 | Ikezaki | G01R 33/5611 324/309 |

OTHER PUBLICATIONS

International Search Report for PCT/JP2014/053954, dated Apr. 28, 2014, 4 pages.
Written Opinion of the ISA for PCT/JP2014/053954, dated Apr. 28, 2014, 3 pages.

* cited by examiner

FIG.10
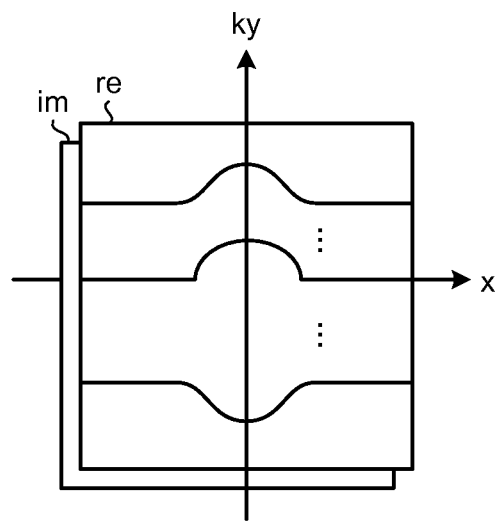
PHASE CORRECTION
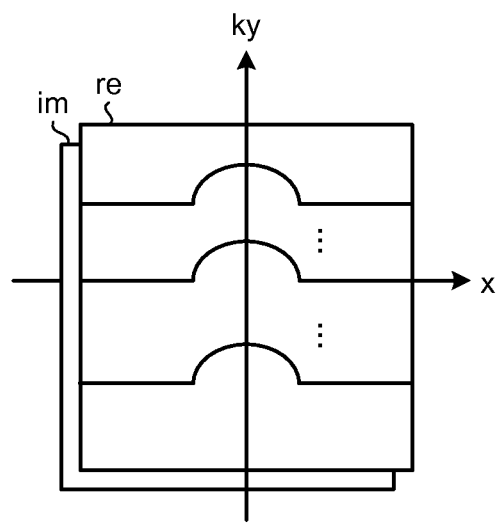

FIG.19
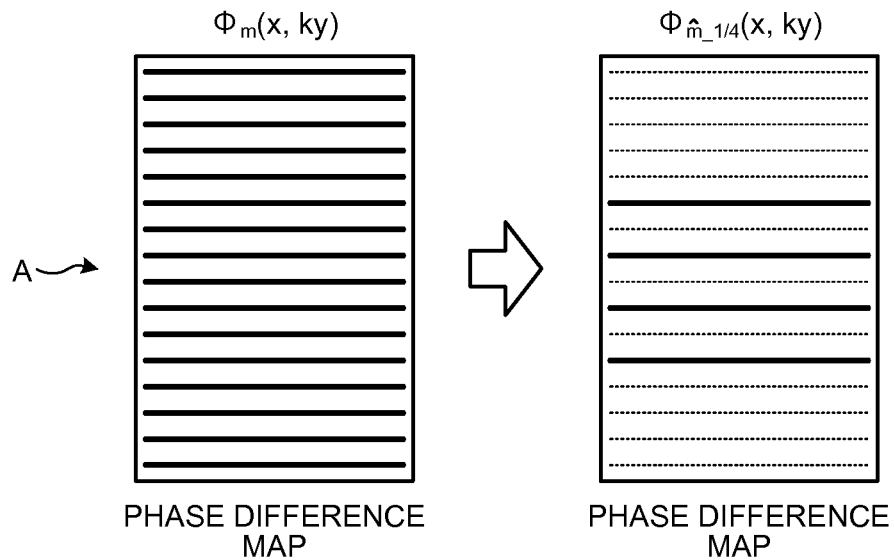
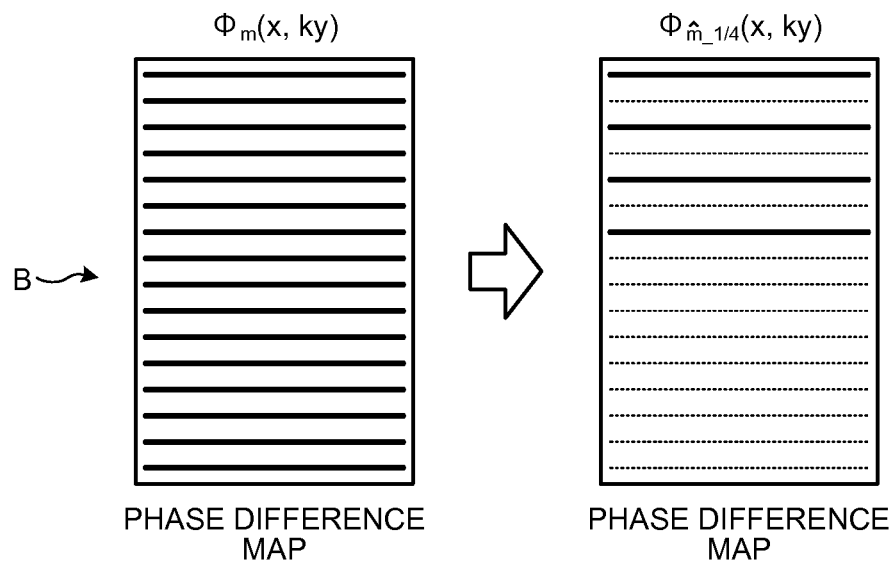

US 10,302,725 B2

MRI APPARATUS THAT CONTINUOUSLY GENERATES AND COLLECTS MULTIPLE ECHO K-SPACE DATA FROM WHICH ODD AND/OR EVEN NUMBERED COLLECTED GROUPS OF K-SPACE DATA ARE EXTRACTED AND SEPARATELY PROCESSED

CROSS-REFERENCE TO RELATED APPLICATIONS

This application is a continuation of PCT international application Ser. No. PCT/JP2014/053954 filed on Feb. 19, 2014 which designates the United States, incorporated herein by reference, and which claims the benefit of priority from Japanese Patent Application No. 2013-029957, filed on Feb. 19, 2013, the entire contents of which are incorporated herein by reference.

FIELD

Embodiments described herein relate generally to a magnetic resonance imaging apparatus.

BACKGROUND

Magnetic resonance imaging is a method of imaging that magnetically excites nuclear spins of a subject placed in a static magnetic field with a radio frequency (RF) pulse of a Larmor frequency thereof and generates an image from magnetic resonance signals generated along with the excitation.

Echo planar imaging (EPI) is one of the methods of imaging by the magnetic resonance imaging. EPI is a method of high-speed imaging that, after applying an excitation pulse, applies at high speed and continuously a readout gradient magnetic field, while inverting polarity, thereby continuously generating multiple echo signals. It is known that EPI generates N/2 artifacts caused by the non-uniformity of a static magnetic field or the like, and techniques for reducing the N/2 artifacts have been developed.

BRIEF DESCRIPTION OF THE DRAWINGS

FIG. 10 is a diagram for illustrating the phase correction in the second embodiment;

FIG. 19 and FIG. 20 are diagrams for illustrating the adjustment of the application range of the phase difference map in the fourth embodiment;

DETAILED DESCRIPTION

A magnetic resonance imaging apparatus according to an embodiment includes sequence controlling circuitry and image generating circuitry. The sequence controlling circuitry is configured to continuously apply, after application of an excitation pulse, a readout gradient magnetic field while inverting polarity to control execution of a pulse sequence that continuously generates multiple echo signals and configured to collect echo signals for multiple channels by parallel imaging. The image generating circuitry is configured to extract at least one of an even-number-th collected echo signal group and an odd-number-th collected echo signal group from multiple echo signals continuously collected and configured to generate at least one of an even-number-th image and an odd-number-th image using the extracted echo signal group for the multiple channels and sensitivity distribution for the multiple channels.

The following describes a magnetic resonance imaging apparatus (hereinafter, referred to as an "MRI apparatus" as appropriate) according to embodiments with reference to the drawings. Embodiments are not limited to the following embodiments. In principle, details described in each of the embodiments can also be applied to other embodiments in the same manner.

First Embodiment

Figure 1:
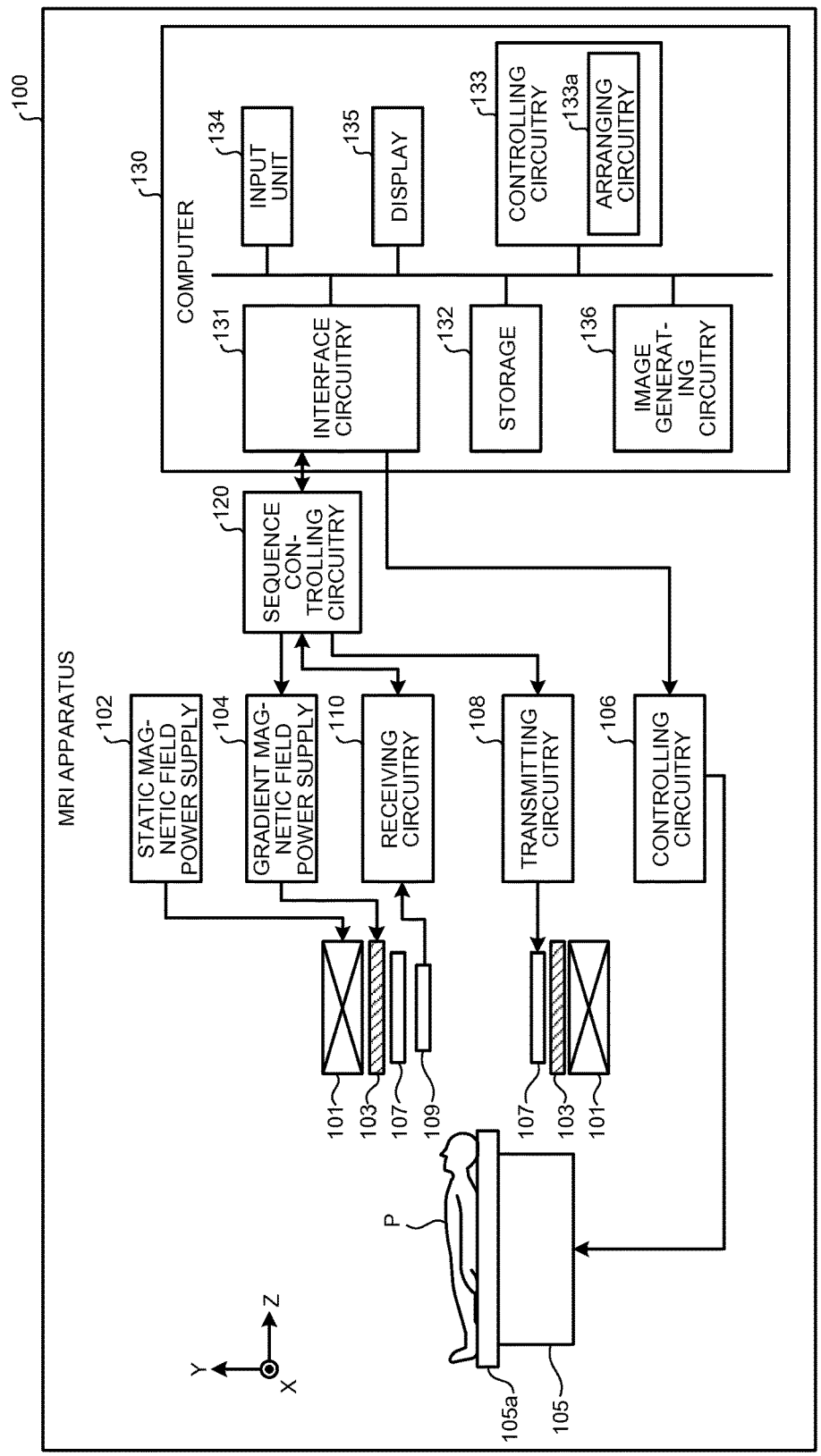
FIG. 1 is a functional block diagram illustrating a configuration of an MRI apparatus according to a first embodiment.

FIG. 1 is a functional block diagram illustrating a configuration of an MRI apparatus 100 according to a first embodiment. As illustrated in FIG. 1, the MRI apparatus 100 includes a static magnetic field magnet 101, a static magnetic field power supply 102, a gradient coil 103, a gradient magnetic field power supply 104, a couch 105, couch controlling circuitry 106, a transmitting coil 107, transmitting circuitry 108, a receiving coil array 109, receiving circuitry 110, sequence controlling circuitry 120, and a computer 130. The MRI apparatus 100 does not include a subject P (a human body, for example). The configuration illustrated in FIG. 1 is merely an example. Respective units within the sequence controlling circuitry 120 and the computer 130, for example, may be integrated or separated as appropriate.

The static magnetic field magnet 101 is a magnet formed in a hollow cylindrical shape and generates a static magnetic field in its space inside. The static magnetic field magnet 101 is, for example, a superconductive magnet and receives supply of a current from the static magnetic field power supply 102 to be magnetized. The static magnetic field power supply 102 supplies a current to the static magnetic field magnet 101. The static magnetic field magnet 101 may be a permanent magnet, and in this case, the MRI apparatus 100 need not comprise the static magnetic field power supply 102. The static magnetic field power supply 102 may be provided separately aside from the MRI apparatus 100.

The gradient coil 103 is a coil formed in a hollow cylindrical shape and is positioned inside the static magnetic field magnet 101. The gradient coil 103 is formed by combining three coils corresponding to respective X, Y, and Z axes that are orthogonal to each other. These three coils individually receive supply of currents from the gradient magnetic field power supply 104 to generate gradient magnetic fields the magnetic field intensity of which changes along the respective X, Y, and Z axes. Examples of the gradient magnetic fields of the respective X, Y, and Z axes generated by the gradient coil 103 include a gradient magnetic field for slicing Gs, a gradient magnetic field for phase encoding Ge, and a gradient magnetic field for readout Gr. The gradient magnetic field power supply 104 supplies a current to the gradient coil 103.

The couch 105 includes a couchtop 105a on which the subject P is mounted and inserts the couchtop 105a into a cavity (an imaging port) of the gradient coil 103 with the subject P mounted thereon under the control of the couch controlling circuitry 106. The couch 105 is generally installed so that the longitudinal direction thereof is parallel to a central axis of the static magnetic field magnet 101. The couch controlling circuitry 106 drives the couch 105 to move the couchtop 105a in the longitudinal direction and an up-and-down direction under the control of the computer 130.

The transmitting coil 107 is positioned inside the gradient coil 103 and receives supply of an RF pulse from the transmitting circuitry 108 to generate a high-frequency magnetic field. The transmitting circuitry 108 supplies, to the transmitting coil 107, an RF pulse corresponding to a Larmor frequency determined by the type of a target atom and magnetic field intensity.

The receiving coil array 109 is positioned inside the gradient coil 103 and receives a magnetic resonance signal (hereinafter, referred to as an "MR signal" as appropriate) generated by the subject P by the influence of the high-frequency magnetic field. The receiving coil array 109, upon receiving the MR signal, outputs the received MR signal to the receiving circuitry 110. In the first embodiment, the receiving coil array 109 includes one or more, typically multiple coil elements.

The transmitting coil 107 and the receiving coil array 109 described above are mere examples. The transmitting coil 107 and the receiving coil array 109 may be configured by combining one or more of coils having only transmission functionality, coils having only reception functionality, and coils having transmission and reception functionality.

The receiving circuitry 110 detects the MR signal output from the receiving coil array 109 and generates MR data based on the detected MR signal. Specifically, the receiving circuitry 110 digitally converts the MR signal output from the receiving coil array 109, thereby generating the MR data. The receiving circuitry 110 transmits the generated MR data to the sequence controlling circuitry 120. The receiving circuitry 110 may be provided on the frame apparatus including the static magnetic field magnet 101 and the gradient coil 103.

In the first embodiment, the MR signals output from the respective coil elements of the receiving coil array 109 are distributed and combined as appropriate to be output to the receiving circuitry 110 in a unit called a channel or the like. The MR data is therefore handled for each channel in the subsequent processing following the processing by the receiving circuitry 110. The total number of the coil elements and the total number of the channels may be equal, the total number of the channels may be less than the total number of the coil elements, or on the contrary, the total number of the channels may be more than the total number of the coil elements. The expressions "respective channels" or "each channel" below indicates that the processing may be performed for each coil element or performed for each channel in which coil elements are divided or combined. The timing of division or combination is not limited to the above-described timing. The MR signals or pieces of MR data may be divided or combined in the unit of channel before processing performed by controlling circuitry 133 described below.

The sequence controlling circuitry 120 drives the gradient magnetic field power supply 104, the transmitting circuitry 108, and the receiving circuitry 110 based on sequence information transmitted from the computer 130, thereby imaging the subject P. The sequence information is information defining a procedure for performing imaging. The sequence information defines the intensity of the current that the gradient magnetic field power supply 104 supplies to the gradient coil 103 and timing for supplying the current, the intensity of the RF pulse that the transmitting circuitry 108 supplies to the transmitting coil 107 and timing for applying the RF pulse, timing at which the receiving circuitry 110 detects the MR signal, or the like. The sequence controlling circuitry 120 is, for example, an integrated circuit such as an application specific integrated circuit (ASIC) and a field programmable gate array (FPGA) or an electronic circuit such as a central processing unit (CPU) and a micro processing unit (MPU).

Figure 2:
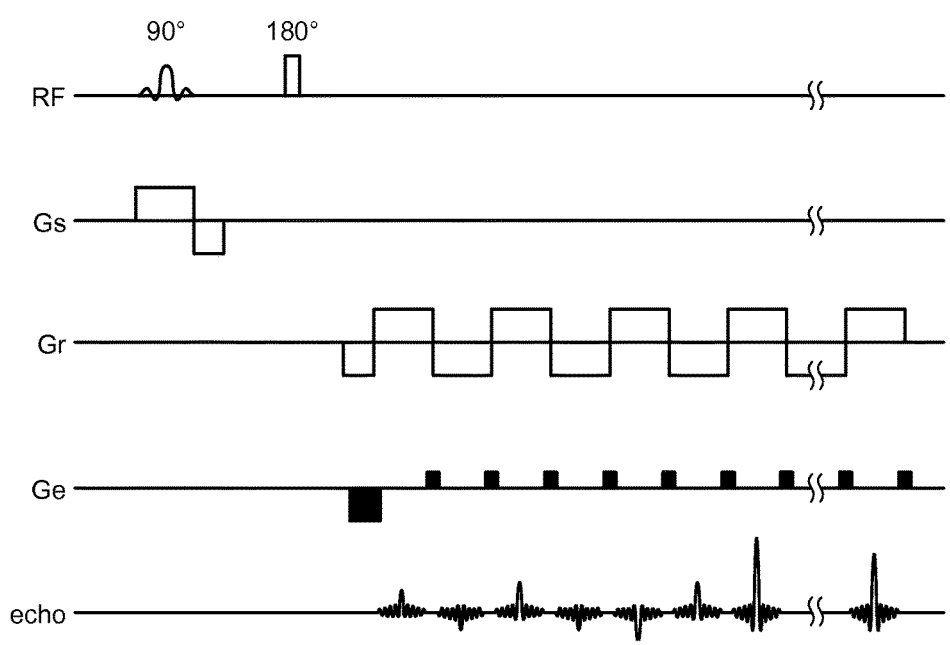
FIG. 2 is a diagram illustrating a pulse sequence by EPI in the first embodiment.

FIG. 2 is a diagram illustrating a pulse sequence by EPI in the first embodiment. EPI includes "SE-EPI" using the spin echo (SE) method that collects spin echo signals generated after application of an excitation pulse and a refocus pulse, "FE-EPI" using the field echo (FE) method that collects echo signals generated after application of an excitation pulse, and "FFE-EPI" using the fast FE (FFE) method. EPI also includes "multi-shot EPI" that generates one image by combining pieces of echo train data obtained by applying excitation pulses multiple times and "single-shot EPI" that generates one image by the application of only one excitation pulse. In the first embodiment, we have the single-shot SE-EPI in mind. However, embodiments are not limited to this, and other EPI is applicable in the same manner.

As illustrated in FIG. 2, by controlling circuitry 120, the sequence controlling circuitry 120 applies a 90° pulse as an excitation pulse, applies the gradient magnetic field for slicing Gs to selectively excite magnetization within the slice surface, and then applies a 180° pulse. The sequence controlling circuitry 120 then applies, at high speed and continuously, the gradient magnetic field for readout Gr, while switching the field (inverting the polarity thereof) in a direction parallel to the slice surface, and at the same time, applies the gradient magnetic field for phase encoding Ge in a direction parallel to the gradient magnetic field for slicing Gs and orthogonal to the gradient magnetic field for readout Gr. The sequence controlling circuitry 120 thus applies the gradient magnetic field for readout Gr at high speed and continuously while switching the field within a time during which transverse magnetization within the slice surface excited by the 90° pulse relaxes, thereby continuously generating multiple MR signals (echo signals) based on magnetic resonance. Consequently, the sequence controlling circuitry 120 is capable of collecting data of the slice surface at high speed. Among the echo signals collected continuously, odd-number-th collected echo signals and even-number-th collected echo signals are different in direction when they are arranged in the k-space. In the following embodiments including the first embodiment, image generating circuitry 136 inverts the direction of the odd-number-th collected echo signals or the even-number-th collected echo signals as needed, aligns the both directions in the same direction and thereafter performs various pieces of processing.

When the sequence controlling circuitry 120 receives the MR data from the receiving circuitry 110 as a result of imaging the subject P by driving the gradient magnetic field power supply 104, the transmitting circuitry 108, and the receiving circuitry 110, the sequence controlling circuitry 120 transfers the received MR data to the computer 130.

The computer 130 performs the entire control of the MRI apparatus 100, image generation, or the like. The computer 130 includes interface circuitry 131, storage 132, controlling circuitry 133, an input unit 134, a display 135, and the image generating circuitry 136. The controlling circuitry 133 includes arranging circuitry 133*a*.

The interface circuitry 131 transmits the sequence information to the sequence controlling circuitry 120 and receives the MR data from the sequence controlling circuitry 120. When the interface circuitry 131 receives the MR data, the interface circuitry 131 stores the received MR data in the storage 132. The MR data stored in the storage 132 is arranged in the k-space by the arranging circuitry 133*a*. Consequently, the storage 132 stores therein pieces of k-space data for multiple channels.

The storage 132 stores therein the MR data received by the interface circuitry 131, the k-space data arranged in the k-space by the arranging circuitry 133*a*, image data generated by image generating circuitry 136, or the like. The storage 132 is, for example, a semiconductor memory device such as a random access memory (RAM) and a flash memory, a hard disk, an optical disc, or the like.

The input unit 134 receives various instructions or information input from an operator. The input unit 134 is, for example, a pointing device such as a mouse and a track ball, a selection device such as a mode switching switch, or an input device such as a keyboard. The display 135 displays various information such as spectrum data and image data under the control of the controlling circuitry 133. The display 135 is, for example, a display device such as a liquid crystal display.

The controlling circuitry 133 performs the entire control of the MRI apparatus 100. Specifically, the controlling circuitry 133 generates the sequence information based on imaging conditions input by the operator through the input unit 134 and transmits the generated sequence information to the sequence controlling circuitry 120, thereby controlling imaging. The controlling circuitry 133 controls image generation performed based on the MR data or controls display by the display 135. The arranging circuitry 133*a* reads the MR data generated by the receiving circuitry 110 from the storage 132 and arranges the MR data in the k-space. The controlling circuitry 133 is, for example, an integrated circuit such as ASIC and FPGA or an electronic circuit such as CPU and MPU.

The image generating circuitry 136 reads out from the storage 132 the k-space data arranged in the k-space by the arranging circuitry 133*a*. The image generating circuitry 136 performs reconstruction processing such as two-dimensional Fourier transform on the k-space data that was read out, thereby generating an image.

The image generating circuitry 136 according to the first embodiment includes, in the process of image generation, a process of generating an image by the PI method, from echo signals for multiple channels collected by the parallel imaging (hereinafter, referred to as "PI" as appropriate) method. The PI method includes a technique called sensitivity encoding (SENSE) system and a technique called simultaneous acquisition of spatial harmonics (SMASH) system (such as generalized autocalibrating partially parallel acquisition (GRAPPA)).

In a typical SENSE system, as the sequence controlling circuitry 120 collects an encode step number required for generating one image in a manner decimated at equal intervals, the k-space data arranged in the k-space by the arranging circuitry 133*a* is also decimated at equal intervals. The decimation rate is called a PI factor (PIF) or the like. For example, the k-space data collected at PIF=2 are in a state in which one encode line out of two encode lines is decimated. By performing reconstruction by two-dimensional Fourier transform using the k-space data in the decimated state, a folded image can be obtained. The image generating circuitry 136 then unfolds the folded image to obtain an unfolded image using the fact that each of the channels has different sensitivity distribution. Specifically, the image generating circuitry 136 generates an image using pieces of k-space data of each of the channels and a sensitivity map indicating sensitivity distribution of each of the channels.

On the other hand, in typical GRAPPA, similarly to the SENSE system, the k-space data is decimated at equal intervals. The image generating circuitry 136 estimates the decimated data from the nearby data in the k-space. The image generating circuitry 136, for example, calculates the decimated data by a weighted linear sum using the pieces of k-space data of the entirety of the channels. This weight is determined from data at PIF=1 (full sampling) collected separately. The data at PIF=1 is called calibration data or the like and is obtained by, for example, collecting only the central part of the k-space at PIF=1. Thereafter, the image generating circuitry 136, for example, performs reconstruction by two-dimensional Fourier transform using k-space data obtained by combining the collected data and estimated data, thereby generating an image.

An overall procedure of the imaging by the MRI apparatus 100 will be briefly described. In an examination, the MRI apparatus 100, for example, performs a preliminary scan prior to an imaging scan that collects the k-space data for generating a diagnostic image. The preliminary scan includes, for example, a scan for collecting profile data indicating sensitivity in a direction where each of the channels is aligned, a scan for collecting a positioning image, a scan for collecting the sensitivity map indicating sensitivity distribution of each of the channels, a scan for collecting spectrum data for determining a center frequency of the RF pulse, and a scan for determining a current value flowing through a correction coil (not illustrated) that adjusts the uniformity of the static magnetic field, which are chosen as appropriate. As the preliminary scan, a scan for determining imaging parameters for use in the imaging scan may be performed.

After these preliminary scans are performed, the imaging scan is performed, thereby collecting the k-space data for generating the diagnostic image. The MRI apparatus 100 generates an image using the k-space data stored in the storage 132. As described below, the image generating circuitry 136 according to the first embodiment generates an image using the sensitivity map collected in the preliminary scan and the k-space data collected in the imaging scan. Note that, for example, it is sufficient that the sensitivity map is be collected before the image generating processing. Therefore, it need not be collected prior to the imaging scan.

Figure 3:
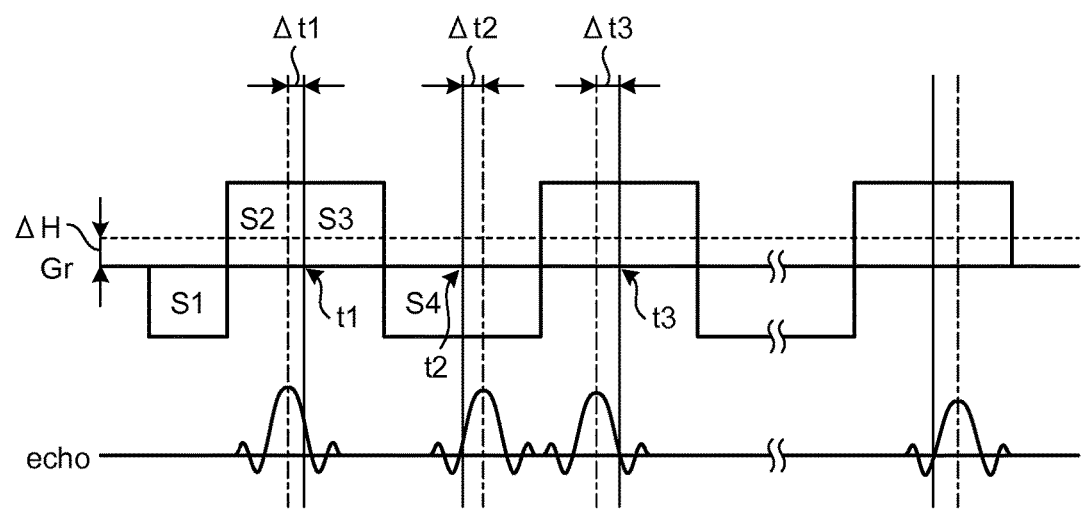
FIG. 3 and FIG. 4 are diagrams for illustrating an N/2 artifact reduced in the first embodiment.
Figure 4:
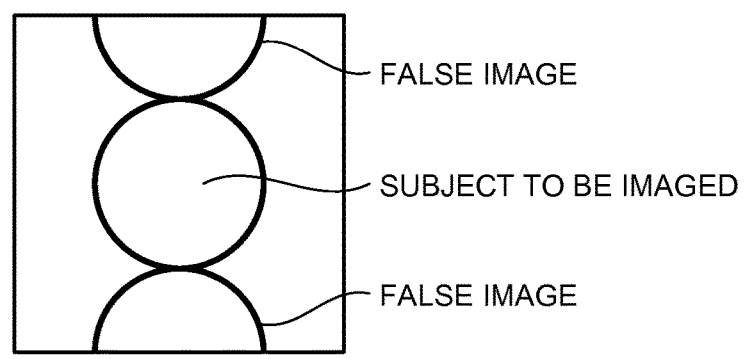

FIG. 3 and FIG. 4 are diagrams for illustrating an N/2 artifact reduced in the first embodiment. When one image is generated from multiple echo signals, it is desirable that positions of peaks of each echo signals be of equal interval on a time axis. Assuming that there is no non-uniformity of the static magnetic field or the like, the peak of an echo signal theoretically occurs at a time when the areas of positive and negative waveforms of the gradient magnetic field for readout Gr are equal to each other. The time corresponds to the middle time between the positive and negative waveforms, and the peaks of each of the echo signals are positioned with the equal intervals on the time axis.

However, under the influence of the non-uniformity of the static magnetic field or the like, the peaks of each echo signals deviate from the middle time between the positive and negative waveforms. As illustrated in FIG. 3, for example, when non-uniformity ΔH of the gradient magnetic field is added to the gradient magnetic field for readout Gr as an offset, an area S2 of the positive waveform becomes just as large as an area S1 of the negative waveform of the gradient magnetic field for readout Gr at a time earlier by Δt1 than the middle time t1. Further, in accordance with this, an area S4 of the negative waveform becomes just as large as an area S3 of the positive waveform at a time later by Δt2 than the middle time t2 by. Under the influence of the non-uniformity of the static magnetic field or the like, the peaks of the respective echo signals thus deviate from each middle times of the positive and negative waveforms and hence are not of equal interval on the time axis.

The N/2 artifact is an artifact that appears when an image is generated using k-space data including such deviation of peak positions on the time axis. As illustrated in FIG. 4, for example, the N/2 artifact strongly emerges at the edges of a subject to be imaged (the central circle) and the edges of false images (the semicircles at both ends).

Figure 5:
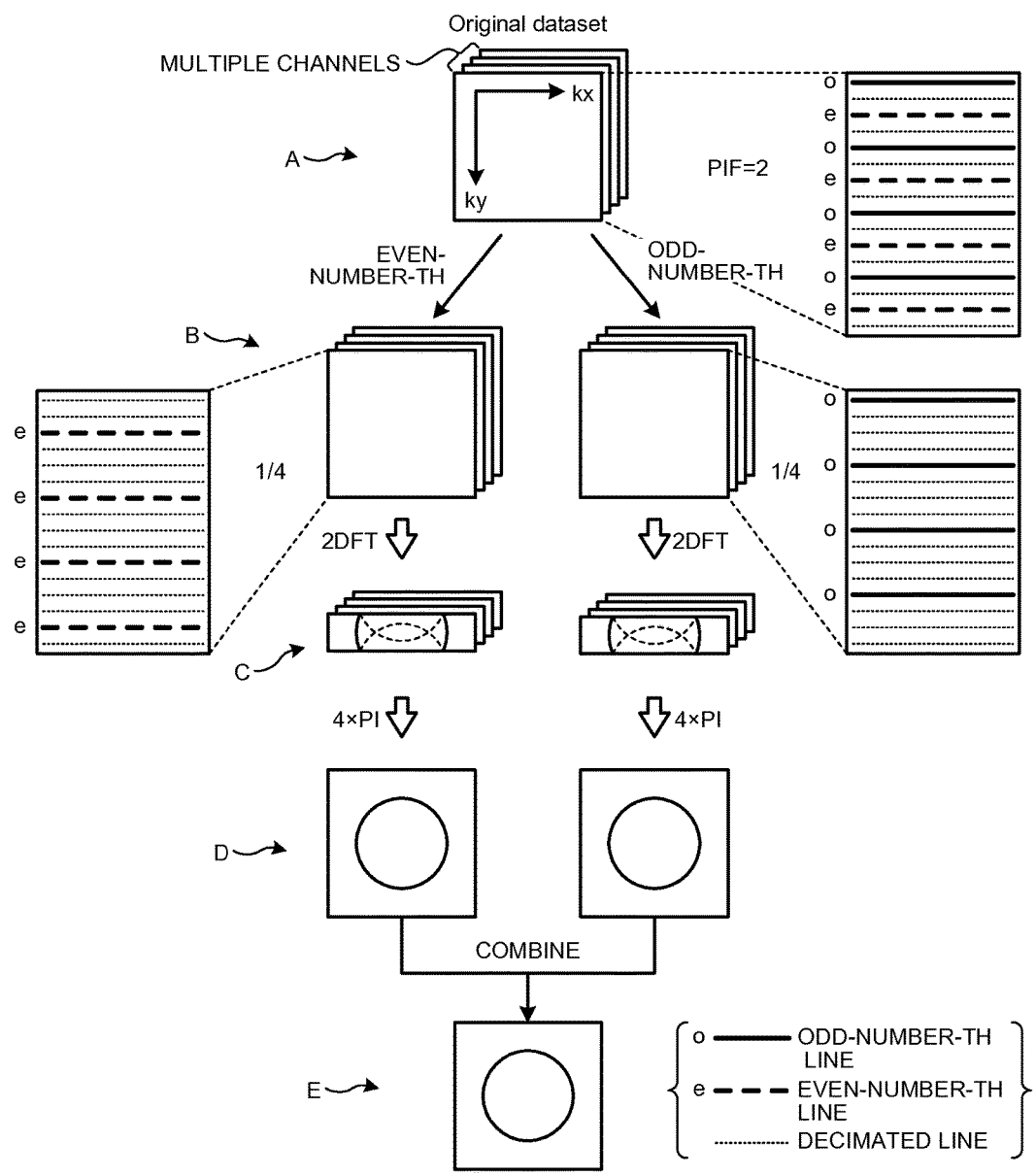
FIG. 5 is a diagram for illustrating processing performed by image generating circuitry in the first embodiment.

FIG. 5 is a diagram for illustrating processing performed by the image generating circuitry 136 according to the first embodiment. In FIG. 5, an example in which the sequence controlling circuitry 120 collects echo signals for multiple channels (for 32 channels, for example) by parallel imaging of PIF=2 is considered. The following describes processing performed by the image generating circuitry 136 considering a state in which the echo signals collected by the sequence controlling circuitry 120 are arranged in the k-space by the arranging circuitry 133a and are stored in the storage 132 as the k-space data. In FIG. 5, echo signals actually collected are indicated by thick lines. After application of the excitation pulse, among the echo signals continuously collected, odd-number-th collected echo signals (hereinafter, referred to as "odd-number-th lines" as appropriate) are indicated by thick solid lines, whereas even-number-th collected echo signals (hereinafter, referred to as "even-number-th lines" as appropriate) are indicated by thick dotted lines. In FIG. 5, the symbol "o" means odd-number-th, whereas the symbol "e" means even-number-th. Echo signal that have been decimated by parallel imaging and not collected (hereinafter, referred to as "decimated lines" as appropriate) are indicated by dotted lines. The symbol "kx" corresponds to a frequency encode direction, whereas the symbol "ky" corresponds to a phase encode direction.

The k-space data described in the first embodiment is merely an example. PIF and the number of channels can be arbitrarily changed. PIF may be changed in the middle of a scan (PIF=2 is changed to PIF=1, which is then changed to PIF=2, for example). The k-space may be a k-space of two dimensions, three dimensions, or other dimensions. In addition, k-space data in which part of the k-space is zero-padded can also be an object to be processed. Although the first embodiment describes a pattern that decimates only the phase encode direction without decimating the frequency encode direction or a slice encode direction, embodiments are not limited to this. The pattern can be changed as appropriate; both the phase encode direction and the slice encode direction may be decimated, for example.

"Original dataset" illustrated in A in FIG. 5 are pieces of k-space data for multiple channels. As illustrated in A in FIG. 5, the pieces of k-space data of each channels are arranged at PIF=2, that is, with one in two phase encode line being decimated. For the sake of convenience of explanation, FIG. 5 illustrates a case where the full sampling is 16 phase encode lines.

First of all, as illustrated in B in FIG. 5, the image generating circuitry 136 extracts, for the pieces of k-space data of the respective channels, an even-number-th collected echo signal group (hereinafter, referred to as an "even-number-th line group" as appropriate) and an odd-number-th collected echo signal group (hereinafter, referred to as an "odd-number-th line group" as appropriate) from the multiple echo signals continuously collected. In this case, as illustrated in B in FIG. 5, three phase encode lines out of four phase encode lines in the k-space data are decimated.

Next, as illustrated in C in FIG. 5, the image generating circuitry 136 performs reconstruction by two-dimensional Fourier transform (2DFT) on the respective pieces of k-space data from which the even-number-th line group and the odd-number-th line group have been extracted. Three phase encode lines out of four phase encode lines in each k-space data are decimated. Thus, folded images are generated as illustrated in C in FIG. 5. In this way, the image generating circuitry 136 generates a folded image (hereinafter, referred to as an "even-number-th folded image" as appropriate) only from the even-number-th line group and generate a folded image (hereinafter, referred to as an "odd-number-th folded image" as appropriate) only from the odd-number-th line group.

Next, as illustrated in D in FIG. 5, the image generating circuitry 136 performs unfolding processing equivalent to PIF=4 using the folded images for the multiple channels and sensitivity maps (not illustrated) for the multiple channels, thereby obtaining unfolded images. Specifically, the image generating circuitry 136 obtains an unfolded image (hereinafter, referred to as an "even-number-th image" as appropriate) from an even-number-th folded image group and obtains an unfolded image (hereinafter, referred to as an "odd-number-th image" as appropriate) from an odd-number-th folded images group. The even-number-th image and the odd-number-th image are images generated only from the even-number-th line group or the odd-number-th line group, and no N/2 artifact appears. When a signal (S)/noise (N) when an image is generated from the echo signals of full sampling is set to "1," the even-number-th image and the odd-number-th image have "S/N ∝ 1/A/4" when the influence of S/N reduction by a geometry factor of the PI method is neglected (when it is assumed that geometry factor=1, for example).

As illustrated in E in FIG. 5, the image generating circuitry 136 combines the even-number-th image and the odd-number-th image. The image generating circuitry 136 combines the even-number-th image and the odd-number-th image by applying sum of square (SOS), for example. The image generating circuitry 136 may perform this combination after the even-number-th image and the odd-number-th image are aligned. A combined image thus combined has "S/N∝1/A/2" when the influence of S/N reduction by the geometry factor of the PI method is neglected (when it is assumed that geometry factor=1, for example). The image generating circuitry 136 may output the even-number-th image and the odd-number-th image generated in D in FIG. 5 without performing this combination and use these images in the subsequent processing.

Although FIG. 5 describes an example in which the processing on the even-number-th line group side and the processing on the odd-number-th line group side are both performed, embodiments are not limited to this. The image generating circuitry 136 may set only one of the even-number-th line group side and the odd-number-th line group side as an object to be processed.

As described above, the first embodiment collects the echo signals by EPI and parallel imaging, thereby achieving high-speed imaging. The first embodiment generates an image with only the even-number-th line group or only the odd-number-th line group as an object to be processed, thereby generating an image in which no N/2 artifact appears.

Second Embodiment

Next, a second embodiment provides the MRI apparatus 100 having a configuration similar to that of the first embodiment, but it is different from the first embodiment in the processing performed by the image generating circuitry 136. Specifically, the image generating circuitry 136, similarly to the first embodiment, extracts the even-number-th or odd-number-th collected echo signal group separately from the echo signals actually collected and generates the even-number-th image and the odd-number-th image separately. It is noted that, in the subsequent process, the image generating circuitry 136 determines phase correction values for matching the phases of the even-number-th lines with the phases of the odd-number-th lines and combines, at the even-number-th lines and the odd-number-th lines, the echo signals actually collected, by conversion using the phase correction values, thereby generating an image.

Figure 6:
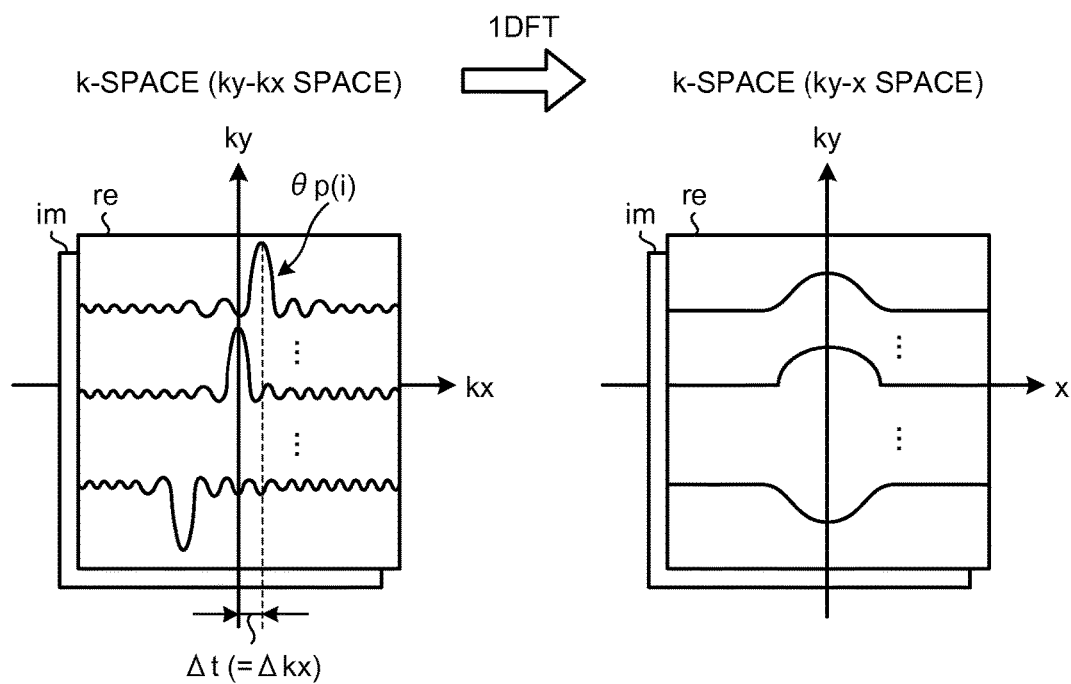
FIG. 6 and FIG. 7 are diagrams for illustrating "phase correction" in a second embodiment.
Figure 7:
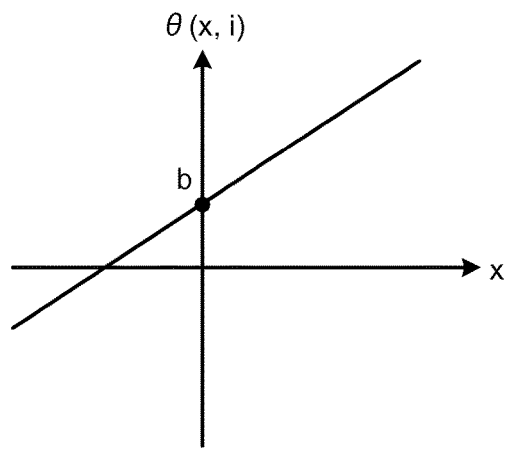

FIGS. 6 and 7 are diagrams for illustrating "phase correction" in the second embodiment. As described above, the second embodiment performs phase correction for matching the phases of the even-number-th line with the phases of the odd-number-th line. Phase deviation to be corrected by the "phase correction" includes (A) deviation in the position of the peak itself of the echo signal on the time axis in each phase encode line and (B) deviation in the phase of the echo signal at a peak time. The following may represent the deviation in phase of the type (A) as "position deviation on the time axis" and represent the deviation in phase of the type (B) as "phase deviation at a peak time."

As described with reference to FIG. 3, the position deviation on the time axis that is of the type (A) means that the peaks of the echo signal in each phase encode line are not of equal interval on the time axis under the influence of the non-uniformity of the static magnetic field or the like. This position deviation on the time axis appears as position deviation Δt (=Δkx) in a kx direction, that is, a frequency encode axis on the k-space (ky-kx space) as illustrated in FIG. 6. The phase deviation at a peak time that is of the type (B) means that an imaginary component of the echo signal that is complex data (a real component and the imaginary component) is not "0" at a peak time, and the value of the echo signal deviates in an angular direction on a complex plane. On the k-space (ky-kx space) illustrated in FIG. 6, the phase deviation at a peak time is represented as θp(i). The symbol "i" is a phase encode step on a ky axis.

Both of the deviations in phase that are of the type (A) and (B) appear as linear phase changes in a real-space x direction on a k-space (ky-x space) obtained by performing one-dimensional Fourier transform (1DFT) on the k-space (ky-kx space) in the kx direction. In other words, both the deviations in phase that are of the type (A) and (B) are determined on the k-space (ky-x space) illustrated in FIG. 6 by calculating the arctangent of the ratio of an imaginary component $I_{im}(x,i)$ to a real component $I_{re}(x,i)$ at each point as indicated in Equation (1):

$$\theta(x,i)=\tan^{-1}(I_{im}(x,i)/I_{re}(x,i)) \quad (1)$$

$\theta(x,i)$ is represented as a linear function with a slope of a and an offset of b as illustrated in FIG. 7 and Equation (2). The slope a corresponds to the position deviation on the time axis that is of the type (A), whereas the offset b corresponds to the phase deviation at a peak time that is of the type (B).

$$\theta(x,i)=ax+b \quad (2)$$

In the second embodiment and other embodiments described below, the expression "phase correction" means that, in principle, both the position deviation on the time axis that is of the type (A) and the phase deviation at a peak time that is of the type (B) are corrected. This phase correction may be performed on the k-space (ky-kx space) or on the k-space (ky-x space) after the one-dimensional Fourier transform in the kx direction. The second embodiment describes a process for performing the phase correction by calculating $\theta(x,i)$ on the k-space (ky-x space).

Figure 8:
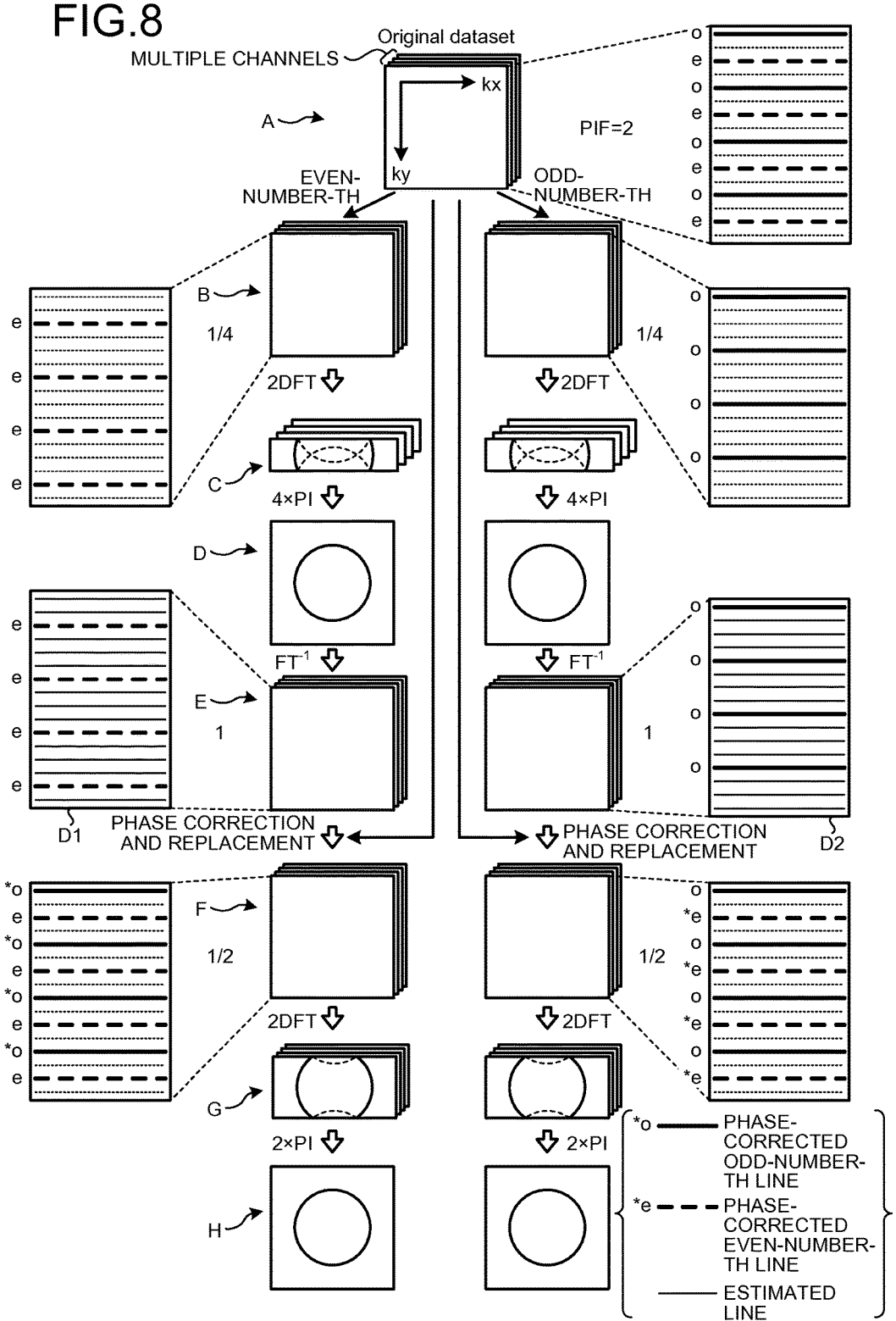
FIG. 8 is a diagram for illustrating processing performed by image generating circuitry in the second embodiment.

FIG. 8 is a diagram for illustrating the processing performed by the image generating circuitry 136 according to the second embodiment. In FIG. 8, the lines represented by the same line type as those of FIG. 5 have the same meanings as those of FIG. 5. In FIG. 8, odd-number-th lines that are actually collected and that are phase-corrected are indicated by thick solid lines and are attached with a symbol "*o". In FIG. 8, even-number-th lines that are actually collected and that are phase-corrected are indicated by thick dotted lines and are attached with a symbol "*e". In FIG. 8, decimated lines (hereinafter, referred to as "estimated lines" as appropriate) filled by being estimated by inverse reconstruction described below are indicated by thin solid lines.

A through D in FIG. 8 are similar to the pieces of processing in A through D of FIG. 5 described in the first embodiment, and descriptions thereof are omitted.

The image generating circuitry 136 obtains the even-number-th image and the odd-number-th image as illustrated in D in FIG. 8 and then, as illustrated in E in FIG. 8, performs inverse reconstruction by two-dimensional inverse Fourier transform on each of the even-number-th image and the odd-number-th image. Specifically, first, the image generating circuitry 136 applies the sensitivity maps of the respective channels to each of the even-number-th image and the odd-number-th image to generate an intermediate even-number-th image and an intermediate odd-number-th image for multiple channels in which the sensitivities of the respective channels are reflected. The image generating circuitry 136 then performs two-dimensional inverse Fourier transform on each of the generated intermediate even-number-th image and intermediate odd-number-th image for multiple channels to generate pieces of k-space data for multiple channels corresponding to the intermediate even-number-th image and pieces of k-space data for multiple channels corresponding to the intermediate odd-number-th image.

As illustrated in E in FIG. 8, the image generating circuitry 136 thus can obtain pieces of k-space data all phase encode lines of which are filled, that is, pieces of k-space data equivalent to full sampling corresponding to each of the even-number-th image and the odd-number-th image. E in FIG. 8 illustrates a state in which the actually collected even-number-th lines and odd-number-th lines in the k-space data equivalent to full sampling obtained by the inverse reconstruction are replaced with the actually collected echo signals.

The image generating circuitry 136 compares k-space data D1 obtained from the even-number-th image with k-space data D2 obtained from the odd-number-th image within the same phase encode lines, thereby deriving phase correction values that match the phase of the even-number-th lines with the phase of the odd-number-th lines. These phase correction values are, in other words, phase correction values that correct both the position deviation on the time axis that is of the type (A) and the phase deviation at a peak time that is of the type (B) described above. Although the second embodiment describes a process that derives the phase correction values in a state that the actually collected even-number-th lines and odd-number-th lines being replaced with the actually collected echo signals, embodiments are not limited to this. A process may be employed that derives the phase correction values by comparing the pieces of k-space data themselves equivalent to full sampling obtained by the inverse reconstruction. In addition, although the second embodiment describes a process that derives the phase correction values by comparing the k-space data D1 obtained from the even-number-th image with the k-space data D2 obtained from the odd-number-th image, embodiments are not limited to this. A process may be employed, for example, that derives the phase correction values by comparing k-space data obtained from the even-number-th image with actually collected k-space data. These also hold true for other embodiments.

Figure 9:
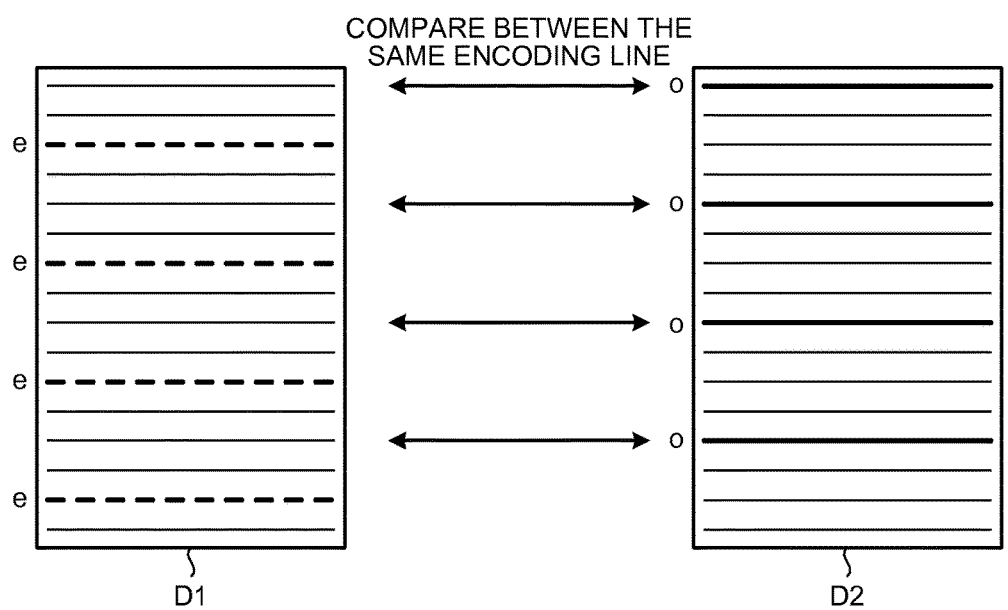
FIG. 9 is a diagram for illustrating a derivation of phase correction values in the second embodiment.

FIG. 9 is a diagram for illustrating the derivation of the phase correction values in the second embodiment. In FIG. 9, the k-space data D1 is basically the same as the k-space data D1 illustrated in FIG. 8, is estimated by inverse reconstruction (two-dimensional inverse Fourier transform), and may be k-space data part of which is replaced with the actually collected even-number-th lines. Similarly, in FIG. 9, the k-space data D2 is basically the same as the k-space data D2 illustrated in FIG. 8, is estimated by inverse reconstruction, and may be k-space data part of which is replaced with the actually collected odd-number-th lines.

As illustrated in FIG. 9, the image generating circuitry 136 compares the echo signals included in the k-space data D1 with the echo signals included in the k-space data D2 between the same encode lines the phase encode steps of which are the same, thereby deriving phase correction values of the respective lines.

The image generating circuitry 136, for example, performs one-dimensional Fourier transform on the echo signals of the k-space data D1 as complex data in the kx direction and then uses the real component and the imaginary component to determine a phase change value in an x direction at a line of i-th phase encode step. Specifically, as indicated in Equation (3), the image generating circuitry 136 calculates the arctangent of the ratio of $I_{im(even)}(x,i)$ to $I_{re(even)}(x,i)$ thereby calculating the phase change value $\theta_{even}(x,i)$ in the x direction at the line of i-th phase encode step:

$$\theta_{even}(x,i)=\tan^{-1}(I_{im(even)}(x,i)/I_{re(even)}(x,i)) \quad (3)$$

The image generating circuitry 136, for example, performs one-dimensional Fourier transform on the echo signals of the k-space data D2 as complex data in the kx direction and then uses the real component and the imaginary component to determine phase change values in the x direction at a line of i-th encode step. Specifically, as indicated in Equation (4), the image generating circuitry 136 calculates the arctangent of the ratio of $I_{im(odd)}(x,i)$ to $I_{re(odd)}(x,i)$ thereby calculating the phase change values $\theta_{odd}(x,i)$ in the x direction:

$$\theta_{odd}(x,i)=\tan^{-1}(I_{im(odd)}(x,i)/I_{re(odd)}(x,i)) \quad (4)$$

The image generating circuitry 136 then derives the phase correction values that match the phase $\theta_{even}(x,i)$ with the phase $\theta_{odd}(x,i)$ for, for example, each of the echo signals corresponding to the odd-number-th lines among the k-space data (hereinafter, referred to as "k-space (ky-x space) data" as appropriate) D1 obtained after performing the one-dimensional Fourier transform in the kx direction. These phase correction values may be a phase correction values that match those to either the phases $\theta_{even}(x,i)$ or the phases $\theta_{odd}(x,i)$ or may be phase correction values that match both to values other than the both. In the case of the former, and when the phases are matched to the phases $\theta_{even}(x,i)$, the image generating circuitry 136 determines a phase difference $\Delta\phi(x,i)$ as indicated in Equation (5) with the phases $\theta_{even}(x,i)$ being chosen as phase references. These phase difference $\Delta\phi(x,i)$ are the phase correction values. As indicated in Equation (6), the image generating circuitry 136 performs phase correction with the phase difference obtained in Equation (5). FIG. 10 is a diagram for illustrating the phase correction in the second embodiment. As illustrated in FIG. 10, on the ky-x space, the respective lines match on the time axis. The respective lines also have the same phase at the peak time. It is noted that in the case of the former, the number of conversion processing performed using the phase correction values becomes smaller than the latter.

$$\Delta\phi(x, i) = \theta_{odd}(x, i) - \theta_{even}(x, i) \quad (5)$$

$$\tilde{S}(x, i) = S(x, i) \cdot \exp(-i \cdot \Delta\phi(x, i)) \quad (6)$$

$$\left( \begin{array}{l} S(x, i): \text{Echo signal before phase correction} \\ \tilde{S}(x, i): \text{Echo signal after phase correction} \end{array} \right)$$

Next, as illustrated in F in FIG. 8, the image generating circuitry 136, for example, performs one-dimensional Fourier transform in the kx direction on each of the echo signals corresponding to the actually collected odd-number-th lines, converts into echo signals on the even-number-th line group side using the respective derived phase correction values, and replaces the converted echo signals with the corresponding echo signals of the k-space (ky-x space) data D1. The k-space data on the ky-x space after replacement thus includes, as the actually collected echo signals, odd-numberth lines "*o" after conversion, which are actually collected odd-number-th lines and have the same characteristic as that of the even-number-th lines, in addition to the actually collected even-number-th lines "e".

The k-space (ky-x space) data D1 is one generated based on the even-number-th line group, and all the echo signals included in the k-space (ky-x space) data D1 have the same characteristic as that of the even-number-th lines, that is, a characteristic of not producing the N/2 artifact. The odd-number-th lines converted using the phase correction values derived from the even-number-th lines also have the same characteristic as that of the even-number-th lines, that is, a characteristic of not producing the N/2 artifact. In the end, the k-space (ky-x space) data after replacement has a characteristic of not producing the N/2 artifact.

Thereafter, as illustrated in G in FIG. 8, the image generating circuitry 136 performs reconstruction by two-dimensional Fourier transform on the respective pieces of k-space data after replacement for the multiple channels to obtain folded images for the multiple channels. For example, the image generating circuitry 136 performs one-dimensional inverse Fourier transform in the kx direction one more time on the k-space data on which phase correction has been performed on the ky-x space and which has been subject to a replacement, thereby giving the replaced k-space data back to the k-space data on the ky-kx space again. After that, the image generating circuitry 136 performs reconstruction by two-dimensional Fourier transform. It is noted that embodiments are not limited to this. The image generating circuitry 136, for example, may perform reconstruction by performing one-dimensional Fourier transform in the ky direction that is the other direction, on the k-space data on which phase correction has been performed on the ky-x space and which has been subject to a replacement.

Next, as illustrated in H in FIG. 8, the image generating circuitry 136 performs unfolding processing equivalent to PIF=2 using the folded images for the multiple channels and sensitivity maps (not illustrated) for the multiple channels, thereby obtaining unfolded images. Although the processing of the reconstruction by two-dimensional Fourier transform and the unfolding processing by the PI method are separately described above, embodiments are not limited to this. On condition that the same result is obtained as a whole, some processing procedures may be reordered or concurrently performed. This also holds true for other embodiments.

When the image in D in FIG. 8 and the image in H in FIG. 8 are compared with each other, the image in H has an increased S/N owing to the additional number of lines replaced with the actually collected odd-number-th lines. This is because the actually collected echo signals have lower noise correlation, and accumulated noise is reduced.

As illustrated in FIG. 8, the processing performed by the image generating circuitry 136 is similarly performed for the pieces of k-space data on the odd-number-th line group side. However, embodiments are not limited to this. The image generating circuitry 136 may set only one of the even-number-th line group side and the odd-number-th line group side as an object to be processed. Alternatively, the image generating circuitry 136 may combine the image obtained from the even-number-th line group side and the image obtained from the odd-number-th line group side. In the second embodiment, G in FIG. 8 and thereafter, an example of generating an image using only the actually collected echo signals has been described. However, embodiments are not limited to this. The image generating circuitry 136, for example, may further combine the estimated lines estimated by the inverse reconstruction and the actually collected echo signals to generate an image. In this case, the k-space data is full sampling data, and unfolded images are directly obtained by two-dimensional Fourier transform (or one-dimensional Fourier transform in the ky direction, on the k-space data on which a phase correction is performed on the ky-x space and which has been subject to a replacement).

An example of the second embodiment will be briefly summarized as follows. The sequence controlling circuitry 120 collects an echo signal group by double-speed (PIF=2) parallel imaging. The image generating circuitry 136 divides the echo signal group collected by the sequence controlling circuitry 120 into even and odd respective datasets, unfolds the respective datasets at quadruple speed, and separately generates an even-number-th image and an odd-number-th image. The image generating circuitry 136 performs inverse Fourier transform on the respective even-number-th image and the odd-number-th image, thereby giving them back to the raw data in the ky-kx space. Next, the image generating circuitry 136 compares a raw dataset of only the even line group with a raw dataset of only the odd-number-th line group, to the echo signal group actually collected at double speed on the ky-x space. Thereafter, the generating circuitry 136 derives the phase correction values from the corresponding even-number-th line and odd-number-th line. The image generating circuitry 136 then performs phase correction on the echo signals actually collected at double speed on the ky-x space and performs replacement on the raw dataset of only the even-number-th line group and the raw dataset of only the odd-number-th line group. The image generating circuitry 136 then performs image reconstruction (two-dimensional Fourier transform or one-dimensional Fourier transform in the ky direction) on the respective raw datasets after replacement and generates a combined image as needed.

As described above, in the second embodiment, the echo signals actually collected are combined at the even-number-th lines and the odd-number-th lines, by the conversion using the phase correction values, to generate an image. Consequently, in the second embodiment image can be unfolded by PIF at the time of echo signal collection. Therefore, image quality is further increased compared to the even-number-th image and the odd-number-th image of the first embodiment. In addition, in the second embodiment, phase correction values are derived by the comparison between corresponding lines of the same phase encode. The phase correction by the thus derived phase correction value is high precision. In addition, in the second embodiment, the phase correction is performed in the ky-x space after performing one-dimensional Fourier transform in the kx direction. In this case, both the position deviation on the time axis that is of the type (A) and the phase deviation at a peak time that is of the type (B) can be corrected based on $\theta(x,i)$ calculated on the ky-x space. Therefore, the phase correction can be realized by relatively simple processing.

Modification of Second Embodiment

The second embodiment describes an example in which the image generating circuitry 136 derives the phase correction value for each line by comparing the same phase encode lines and thereafter applies the derived phase correction value to each line. However, embodiments are not limited to this. When the phase correction is performed on the ky-x space after performing one-dimensional Fourier transform in the kx direction, for example, the image generating circuitry 136 may generate a "phase difference map"

that accumulates phase correction values corresponding to an entirety of phase encode lines and may perform the phase correction using the phase difference map. In other words, the phase difference map incorporates therein phase correction values for the even-number-th lines and phase correction values for the odd-number-th lines. In addition, when two-dimensional k-space data is assumed, for example, the phase difference map is generated as two-dimensional information.

Figure 11:
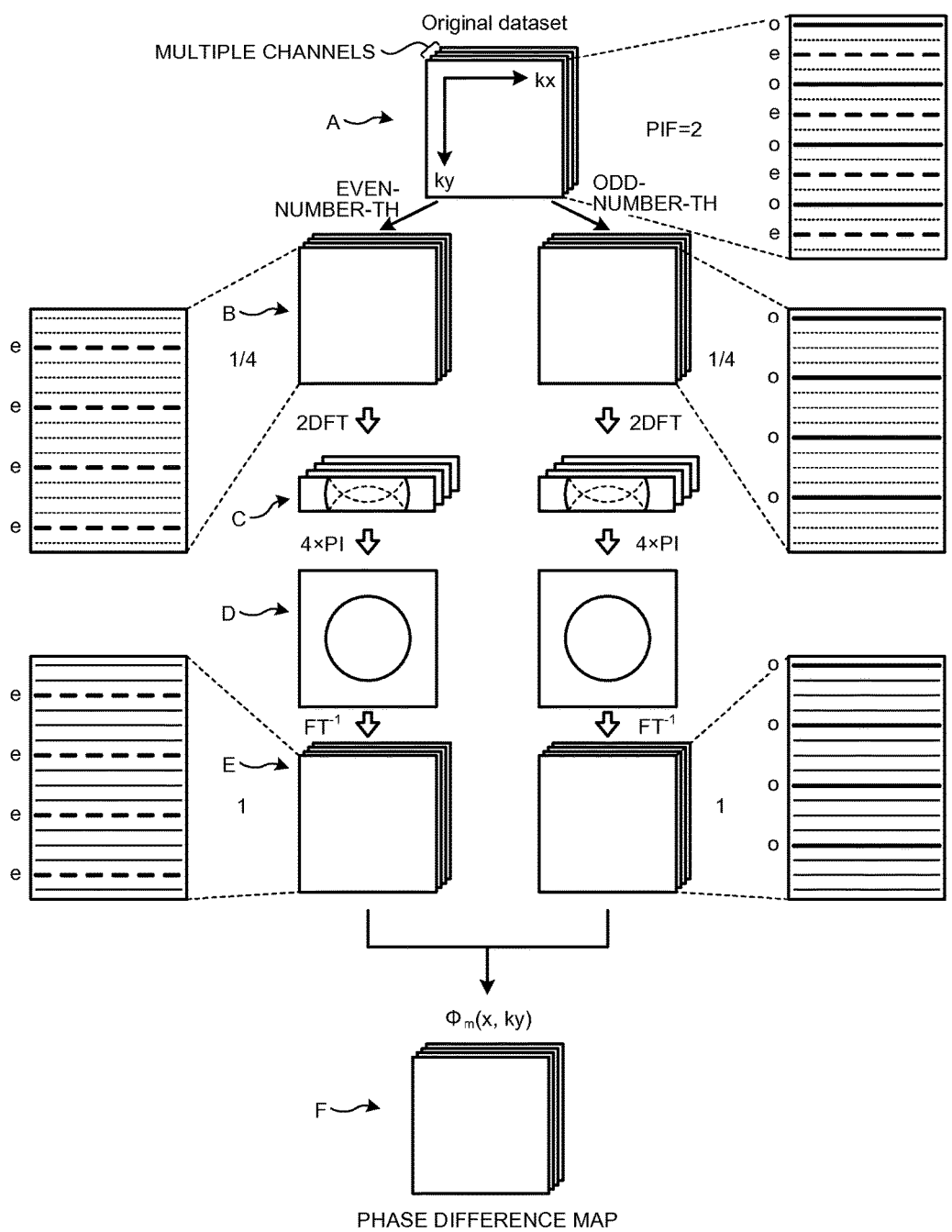
FIG. 11 and FIG. 12 are diagrams for illustrating processing performed by image generating circuitry according to a modification of the second embodiment.
Figure 12:
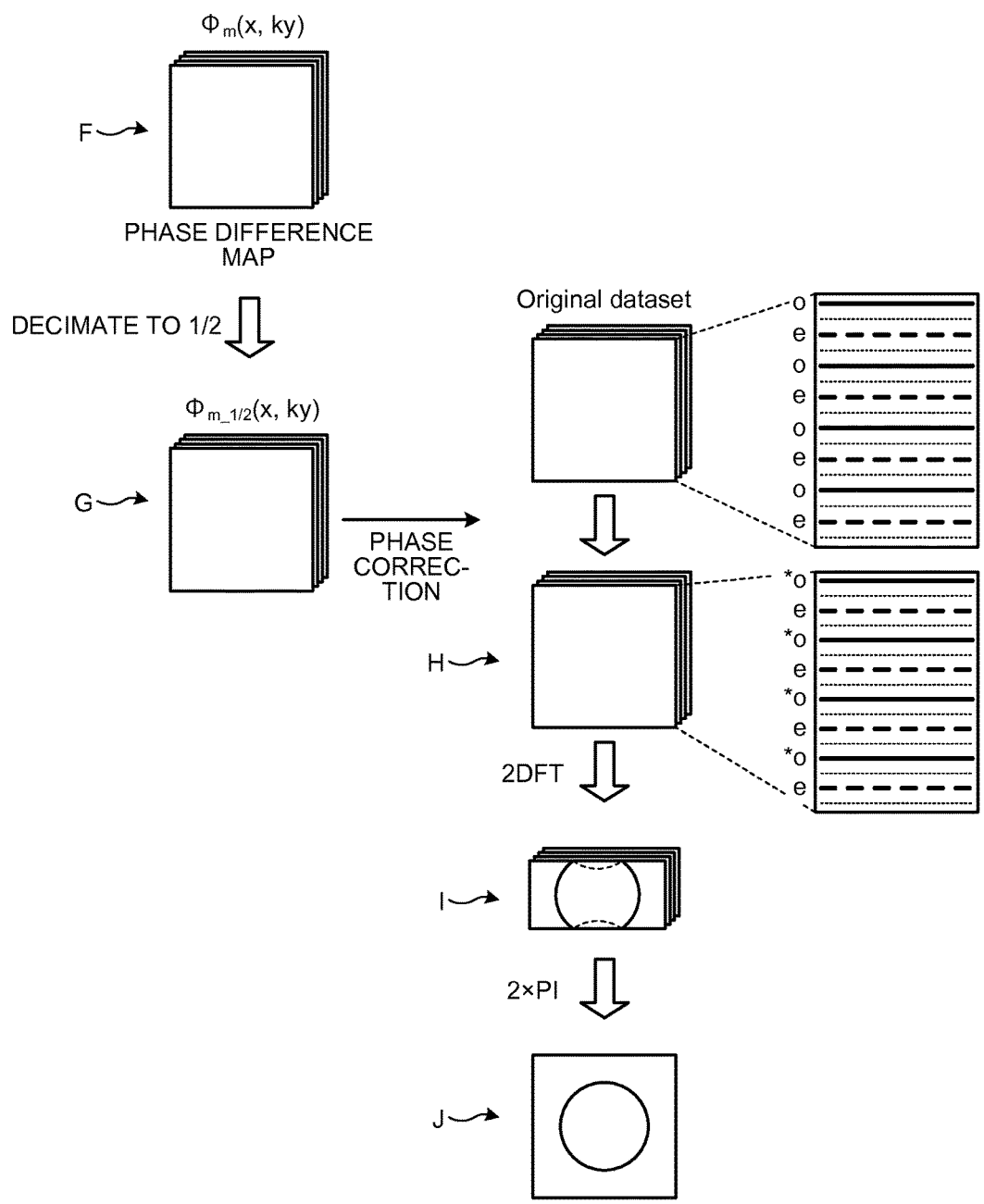

FIGS. 11 and 12 are diagrams for illustrating processing performed by the image generating circuitry 136 according to a modification of the second embodiment. A through E in FIG. 11 are similar to A through E in FIG. 8 described in the second embodiment, and descriptions thereof are omitted.

As illustrated in E in FIG. 11, the image generating circuitry 136 obtains the k-space data corresponding to the even-number-th image and the k-space data corresponding to the odd-number-th image by inverse reconstruction. Then, similarly to the second embodiment, the image generating circuitry 136 performs one-dimensional Fourier transform on the respective k-space data in the kx direction. The image generating circuitry 136 then compares the both on the ky-x space to generate a two-dimensional phase difference map $\phi_m(x,ky)$ for the multiple channels as illustrated in F in FIG. 11. The phase difference map $\phi_m(x,ky)$ maps phase correction values for matching the phases of the echo signals included in the k-space in the real-space x direction and the phase encode direction. Next, the image generating circuitry 136 performs one-dimensional Fourier transform on "Original dataset" illustrated in A in FIG. 11 in the kx direction and performs phase correction using this phase difference map $\phi_m(x,ky)$ on this "Original dataset" on the ky-x space. However, in the present modification, "Original dataset" is k-space data arranged at PIF=2. Consequently, as illustrated in G in FIG. 12, the image generating circuitry 136 applies the phase difference map $\phi_m(x,ky)$, decimating one out of two phase encode lines so as to correspond to this PIF. The phase difference map after the decimation is represented as $\phi_{m\_1/2}(x,ky)$.

As illustrated in H in FIG. 12, the image generating circuitry 136 thus obtains the k-space (ky-x space) data in which the phases of the respective echo signals match by phase correction indicated in Equation (7).

$$\tilde{S}(x, ky) = S(x, ky) \cdot \exp(-i \cdot \Phi_{m\_1/2}(x, ky)) \quad (7)$$

$$\begin{pmatrix} S(x, ky): \text{Echo signal before phase correction} \\ \tilde{S}(x, ky): \text{Echo signal after phase correction} \end{pmatrix}$$

Thereafter, similarly to the second embodiment, the image generating circuitry 136 performs one-dimensional inverse Fourier transform in the kx direction one more time to give the k-space data back to the k-space data on the ky-kx space again and then performs reconstruction by two-dimensional Fourier transform to obtain folded images as illustrated in I in FIG. 12. Next, as illustrated in J in FIG. 12, the image generating circuitry 136 performs unfolding processing equivalent to PIF=2, thereby obtaining an unfolded image. Embodiments are not limited to this. The image generating circuitry 136, for example, may perform reconstruction and obtain folded images for the multiple channels by performing one-dimensional Fourier transform in the remaining ky direction on the k-space data on which a phase correction has been performed on the ky-x space and which has been subject to a replacement.

FIG. 12 describes an example in which the processing is performed without dividing "Original dataset" into the even-number-th line group and the odd-number-th line group. Generating the phase difference map makes such processing easy. However, embodiments are not limited to this. Similarly to the embodiment described in FIG. 8 or the like, the even-number-th line group and the odd-number-th line group may be separately extracted from "Original dataset." In this case, the image generating circuitry 136 performs phase correction on the extracted even-number-th line group and odd-number-th line group using the phase difference map $\phi_{m\_1/4}(x,ky)$ where one out of four phase encode lines is decimated. The image generating circuitry 136 may combine the two images generated thereafter.

In FIG. 12, the phase difference map $\phi_{m\_1/2}(x,ky)$ generated using the even-number-th lines as a standard is assumed, and the phase-corrected lines are represented by the phase-corrected odd-number-th line "*o". However, embodiments are not limited to this. When the phase difference map $\phi_{m\_1/2}(x,ky)$ generated using the odd-number-th lines as a standard is assumed, for example, the phase-corrected lines are represented by the phase-corrected even-number-th lines "*e". When the phase difference map $\phi_{m\_1/2}(x,ky)$ generated for matching to another value that is neither those of the even-number-th lines nor those of the odd-number-th lines is assumed, for example, the phase-corrected lines are represented by the phase-corrected odd-number-th lines "*o" and the phase-corrected even-number-th lines "*e".

Third Embodiment

Next, a third embodiment provides the MRI apparatus 100 including a configuration similar to that of the first embodiment, but it is different from the first embodiment in the processing performed by the sequence controlling circuitry 120 and the image generating circuitry 136. Specifically, when the sequence controlling circuitry 120 collects the echo signals, the sequence controlling circuitry 120 collects the echo signals with high density only at the central part of the k-space. The image generating circuitry 136 separately extracts the even-number-th collected echo signal group and the odd-number-th collected echo signal group from the echo signals collected at the central part and generates the even-number-th image and the odd-number-th image of low resolution. Thereafter, similarly to the second embodiment, the image generating circuitry 136 determines phase correction values for matching the phase of the even-number-th line with the phase of the odd-number-th line and combines the echo signals actually collected at even-number-th lines and odd-number-th lines by conversion using the phase correction values, thereby generating an image.

Figure 13:
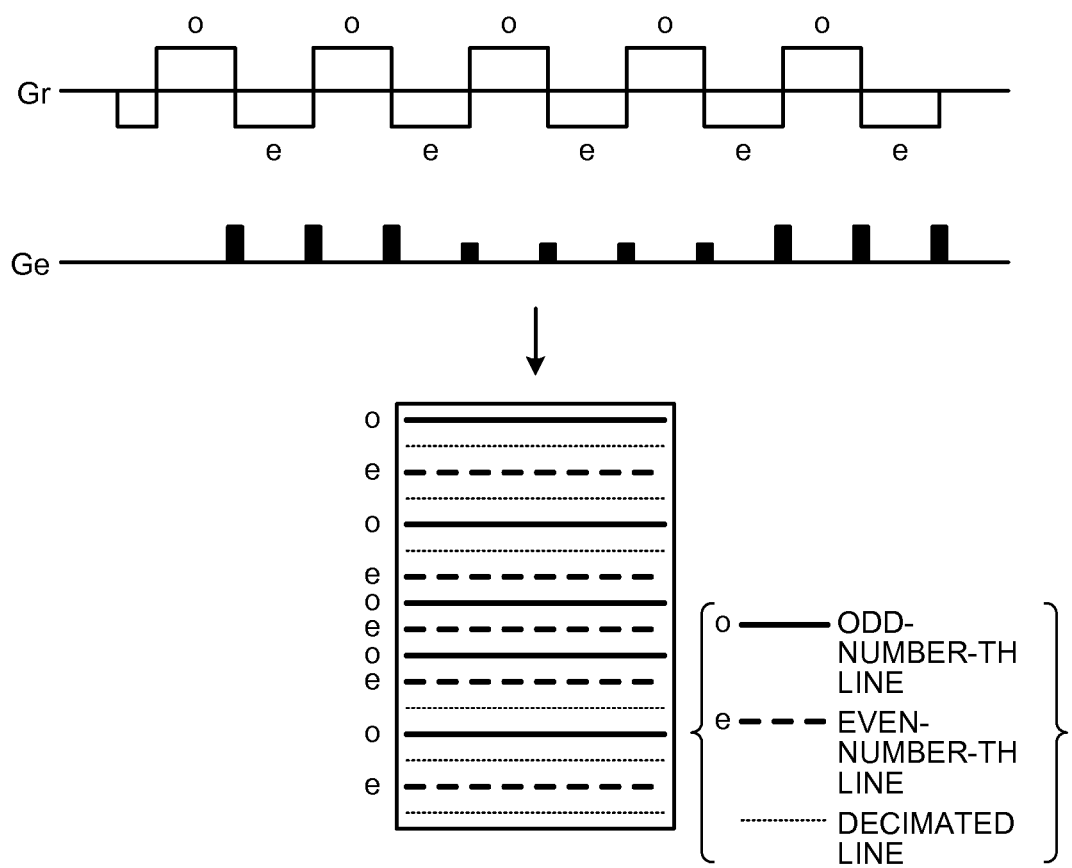
FIG. 13 is a diagram for illustrating processing performed by sequence controlling circuitry according to a third embodiment.

FIG. 13 is a diagram for illustrating the processing performed by the sequence controlling circuitry 120 according to the third embodiment. As illustrated in FIG. 13, when the echo signals are collected sequentially in the order of the peripheral part, the central part, and the peripheral part of the k-space, for example, the sequence controlling circuitry 120 according to the third embodiment controls the gradient magnetic field for phase encoding Ge so that PIF=2, PIF=1 (full sampling), and PIF=2, in that order. The k-space data collected by the sequence controlling circuitry 120 and arranged in the k-space by the arranging circuitry 133a is data where the peripheral part of the k-space is arranged with PIF=2 while the central part is arranged with full sampling as illustrated in FIG. 13.

Figure 14:
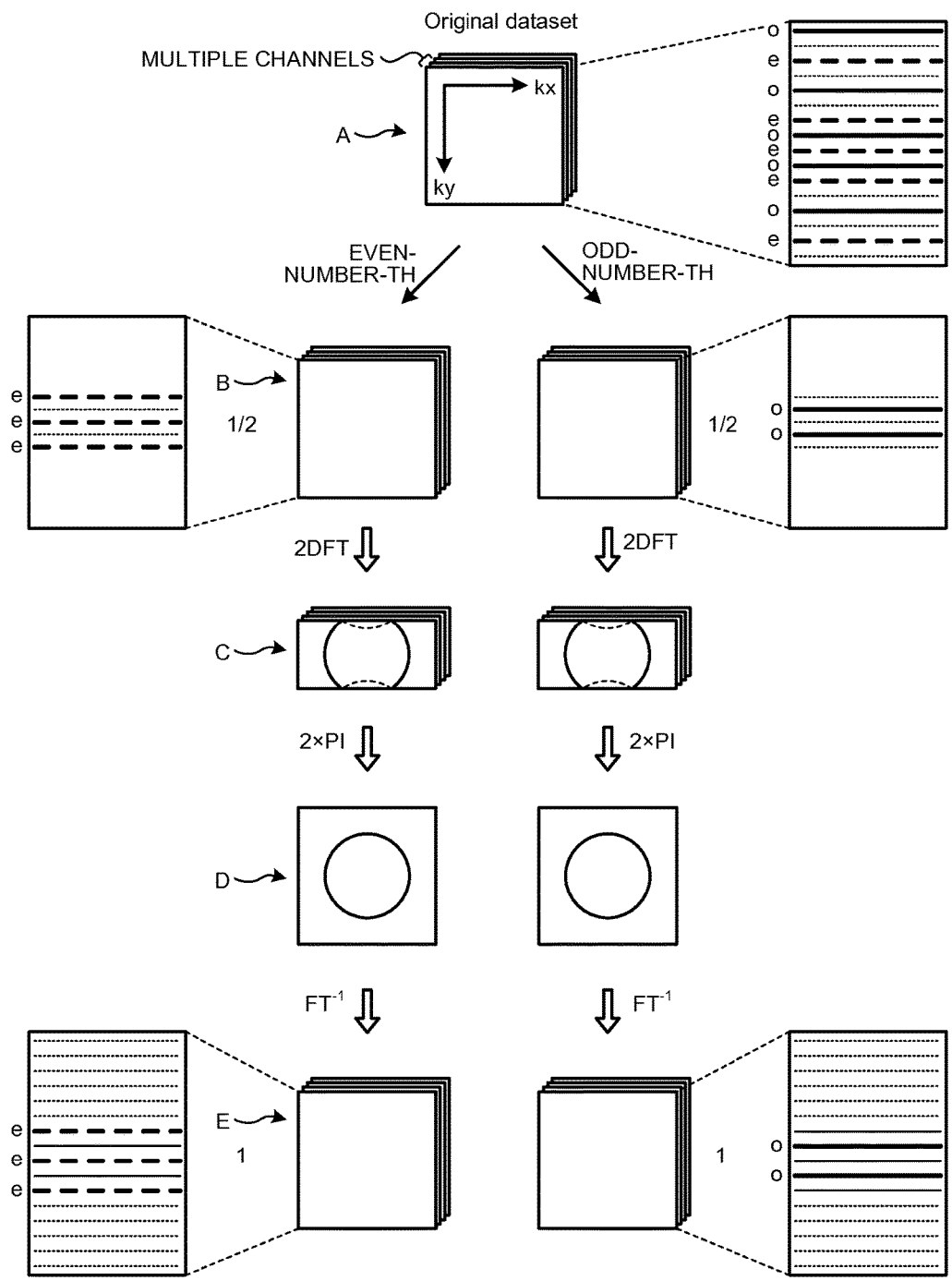
FIG. 14 and FIG. 15 are diagrams for illustrating processing performed by image generating circuitry according to the third embodiment.
Figure 15:
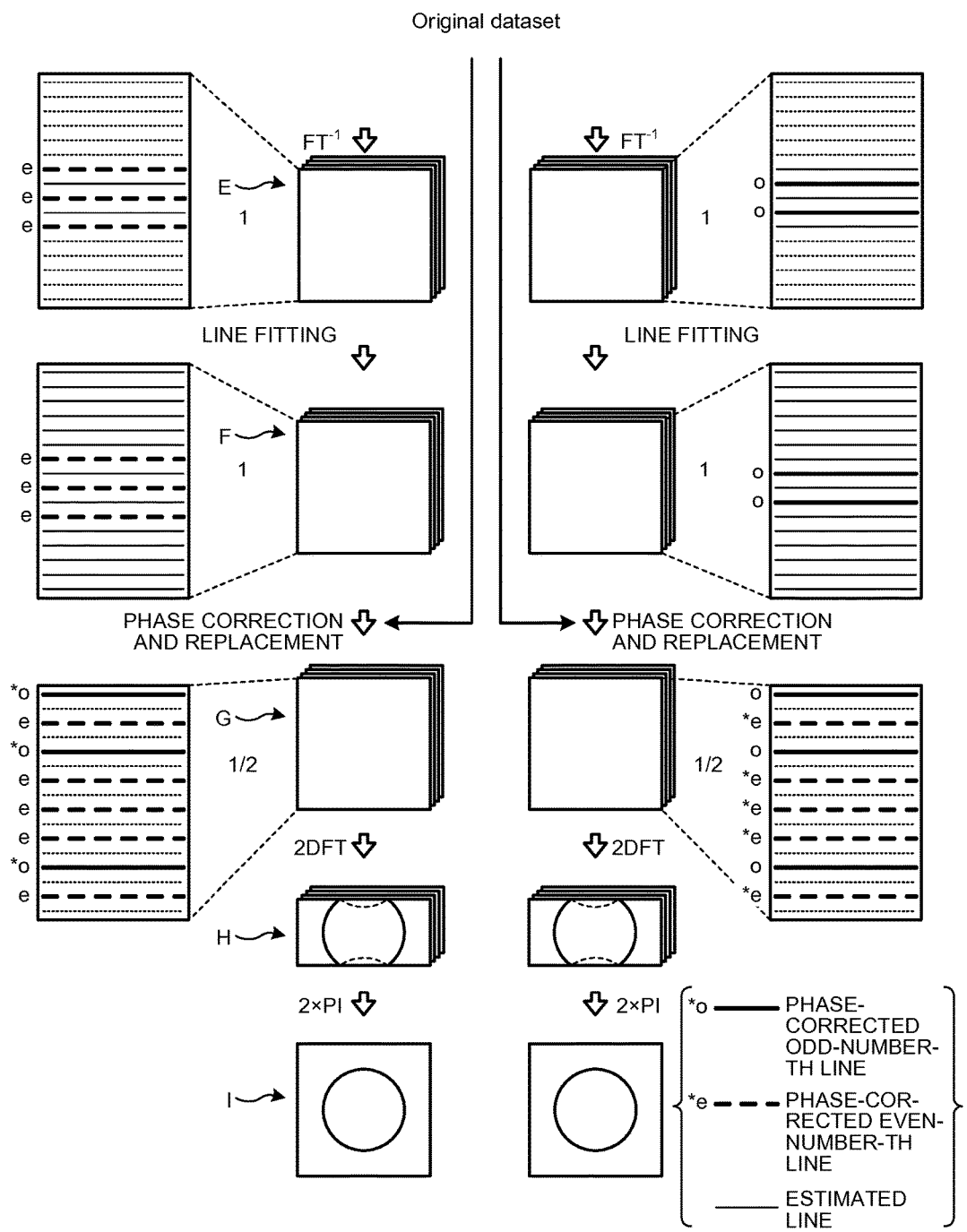

FIGS. 14 and 15 are diagrams for illustrating the processing performed by the image generating circuitry 136 according to the third embodiment. In FIG. 14, the lines represented by the same line type as those of FIG. 8 have the same meanings as those of FIG. 8.

The third embodiment is different from the second embodiment in that the phase correction values are determined by using only the echo signals at the central part of the fully sampled k-space. Specifically, first of all, as illustrated in B in FIG. 14, the image generating circuitry 136 separately extracts the even-number-th line group and the odd-number-th line group from the echo signals at the central part of the k-space in the k-space data of each channel. In this case, as illustrated in B in FIG. 14, one out of two phase encode lines in the k-space data is decimated and arranged.

Next, as illustrated in C in FIG. 14, the image generating circuitry 136 performs reconstruction by two-dimensional Fourier transform on the respective pieces of k-space data from which the even-number-th line group and the odd-number-th line group have been extracted. Next, as illustrated in D in FIG. 14, the image generating circuitry 136 performs unfolding processing equivalent to PIF=2 using the folded images for the multiple channels and sensitivity maps (not illustrated) for the multiple channels, thereby obtaining unfolded images. These images are images of low resolution, but are images containing no N/2 artifact.

Next, the image generating circuitry 136 performs inverse reconstruction by two-dimensional inverse Fourier transform on the respective images obtained in D in FIG. 14, and as illustrated in E in FIG. 14, obtains the k-space data equivalent to full sampling corresponding to the low-resolution images. Specifically, when each of the even-number-th line group and the odd-number-th line group is extracted from the central part of the echo signals that constitutes the low resolution image, some lines becomes absent. The image generating circuitry 136 obtains k-space data in which the lines that become absent are filled. It is noted that E in FIG. 14 illustrates a state in which the actually collected even-number-th lines and odd-number-th lines in the k-space data equivalent to full sampling obtained by the inverse reconstruction are replaced with the actually collected echo signals.

The image generating circuitry 136, similarly to the second embodiment, for the echo signals at the central part of the k-space, compares the k-space data obtained from the even-number-th image with the k-space data obtained from the odd-number-th image within the same phase encode lines, thereby deriving phase correction values that match the phases of the even-number-th lines with the phases of the odd-number-th lines. Specifically, the image generating circuitry 136 compares between the pieces of k-space data and derives the phase correction values on the ky-x space after performing one-dimensional Fourier transform in the kx direction.

The k-space data obtained in E in FIGS. 14 and 15 is the k-space data only the echo signals at the central part of which are filled in a manner equivalent to full sampling. Given this situation, as illustrated in F in FIG. 15, the image generating circuitry 136 performs line fitting (linear or higher-order) about phase change on the pieces of k-space data, and based on the echo signals at the central part, calculates phase change values of the echo signals at the peripheral part, which is a high-frequency side, by estimation. In this way, the image generating circuitry 136 compares the echo signals of the peripheral part calculated by estimation within the same phase encode lines, thereby deriving the phase correction values of the peripheral part. The image generating circuitry 136 thus determines the phase change values of the peripheral part of the respective pieces of k-space data by the line fitting and then compares them to derive the phase correction values of the peripheral part. However, embodiments are not limited to this. The image generating circuitry 136, for example, may directly derive the phase correction values of the peripheral part based on the phase correction values derived for the echo signals at the central part. In addition, processes for calculating the phase change values and the phase correction values are not limited to the line fitting. The image generating circuitry 136, for example, can apply an average value of a plurality of phase correction values derived from the echo signals at the central part as the phase correction values to be used for the conversion of the echo signals at the peripheral part.

Next, similarly to the second embodiment, as illustrated in G in FIG. 15, the image generating circuitry 136, for example, first performs one-dimensional Fourier transform on each of the echo signals corresponding to the actually collected odd-number-th lines in the kx direction, converts into echo signals on the even-number-th line group side using the respective derived phase correction values, and replaces the converted echo signals with the corresponding echo signals.

Thereafter, the image generating circuitry 136 converts the respective pieces of k-space data after replacement for the multiple channels into the pieces of k-space data on the ky-kx space, and as illustrated in H in FIG. 15, performs reconstruction by two-dimensional Fourier transform to obtain folded images for the multiple channels. Embodiments are not limited to this. The image generating circuitry 136, for example, may perform reconstruction by performing one-dimensional Fourier transform in the remaining ky direction on the k-space data on which phase correction has been performed on the ky-x space and which has been a subject to a replacement, thereby obtaining the folded images for the multiple channels. Next, as illustrated in I in FIG. 15, the image generating circuitry 136 performs unfolding processing equivalent to PIF=2 using the folded images for the multiple channels and sensitivity maps (not illustrated) for the multiple channels, thereby obtaining unfolded images.

As illustrated in FIG. 15, the processing performed by the image generating circuitry 136 is similarly performed for the pieces of k-space data on the odd-number-th line group side. However, embodiments are not limited to this. The image generating circuitry 136 may set only one of the even-number-th line group side and the odd-number-th line group side as an object to be processed. Alternatively, the image generating circuitry 136 may combine the image obtained from the even-number-th line group side and the image obtained from the odd-number-th line group side. In the third embodiment, in H in FIG. 15 and the subsequent step, an example of generating an image using only the actually collected echo signals has been explained. However, embodiments are not limited to this. The image generating circuitry 136, for example, may further combine the estimated lines estimated by the inverse reconstruction and the actually collected echo signals to generate an image. In this case, the k-space data is full sampling data, and unfolded images are directly obtained by two-dimensional Fourier transform (or one-dimensional Fourier transform in the ky direction for the k-space data on which a phase correction has been performed on the ky-x space and which has been a subject for a replacement).

Although the third embodiment describes an example of collecting all data points in the kx direction, embodiments are not limited to this. When the sequence controlling circuitry 120 collects the echo signals at the central part of the k-space, for example, the sequence controlling circuitry 120 may collect only the central part also in the kx direction.

As described above, the third embodiment derives the phase correction values using the echo signals collected with high density (full sampling, for example), and PIF can be reduced in the process of image generation. In other words, as can be seen by comparing FIG. 8 with FIG. 14, in the process of image generation, the second embodiment performs image generation by the quadruple-speed PI, whereas the third embodiment performs the image generation by the double-speed PI.

The third embodiment describes an example in which the image generating circuitry 136 derives the phase correction values for each line by comparing the same phase encode lines for the echo signals at the central part of the ky-x space and applies the derived phase correction values to each line. However, embodiments are not limited to this. Similar to the modification of the second embodiment, the image generating circuitry 136 may generate the phase difference map that accumulates phase correction values corresponding to an entirety of phase encode lines and may perform the phase correction using the phase difference map.

An example of the third embodiment will be briefed as follows. The sequence controlling circuitry 120 collects the echo signal group by the parallel imaging at single speed (PIF=1) only in a low-frequency part and at double speed (PIF=2) at the peripheral part (a high-frequency part). The image generating circuitry 136 divides the echo signal group collected by the sequence controlling circuitry 120 into the low-frequency part and the high-frequency part and further divides the low-frequency part into even-number-th and odd-number-th respective datasets. The image generating circuitry 136 unfolds the even-number-th and odd-number-th respective datasets at double speed and separately generates the even-number-th image and the odd-number-th image. The image generating circuitry 136 performs inverse Fourier transform on the respective even-number-th image and the odd-number-th image to give the transformed images back to raw data in the ky-kx space. Next, the image generating circuitry 136 compares a raw dataset of only the even-number-th line group and a raw dataset of only the odd-number-th line group with the echo signal group actually collected at double speed on the ky-x space and derives the phase correction values from the corresponding even-number-th line and the odd-number-th line. In this situation, the pieces of k-space data obtained by the two-dimensional inverse Fourier transform on the respective even-number-th image and odd-number-th image are pieces of k-space data of only the central parts that constituting images of the low-frequency part. Therefore, the image generating circuitry 136 calculates the phase correction values of the peripheral part by line fitting or the like. The image generating circuitry 136 then performs phase correction on the echo signals actually collected at double speed and performs replacement on the raw dataset of only the even-number-th line group and the raw dataset of only the odd-number-th line group on the ky-x space. The image generating circuitry 136 performs phase correction and replacement also on the echo signals at the high-frequency part. The image generating circuitry 136 then performs image reconstruction (two-dimensional Fourier transform and one-dimensional Fourier transform in the ky direction) on the respective raw datasets after replacement. In this third embodiment, the image generating circuitry 136 performs image reconstruction also for the high-frequency part collected with low density using the processing result of only the low-frequency part collected with high density.

Although the third embodiment and the modification thereof describe an example of collecting the echo signals for use in the derivation of the phase correction values at PIF=1 (full sampling), embodiments are not limited to these. The echo signals for use in the derivation of the phase correction values are, for example, collected with higher density (at a lower decimation rate) than PIF when the peripheral part of the k-space is collected.

Fourth Embodiment

In the second embodiment and the third embodiment, the image generating circuitry 136 uses the echo signals collected by the imaging scan for the derivation of the phase correction values. However, embodiments are not limited to these. The echo signals for use in the derivation of the phase correction values may be collected by a scan different from the imaging scan, that is, for example, the preliminary scan. The image generating circuitry 136, for example, may generate the phase difference map from the echo signals collected by the preliminary scan on the ky-x space and may use this phase difference map for the image processing on the echo signals collected by the imaging scan. When the imaging scan is repeated over a plurality of times, for example, the phase difference map generated by the preliminary scan can be used for each of the echo signals collected by the pieces of imaging scan. It is satisfactory if the scan for collecting the echo signals for use in the derivation of the phase correction values is performed before the processing performed by the image generating circuitry 136. Thus, it is not limited to the preliminary scan that is performed prior to the imaging scan. This scan may be called template scan, template shot, or the like.

Figure 16:
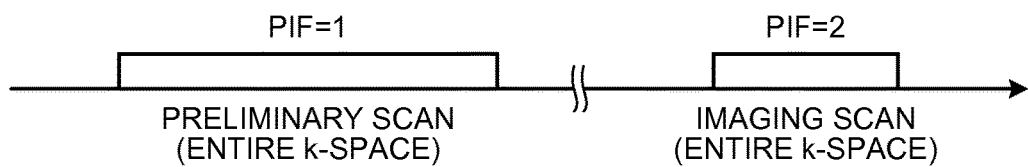
FIG. 16 is a diagram for illustrating processing performed by sequence controlling circuitry according to a fourth embodiment.

FIG. 16 is a diagram for illustrating processing performed by the sequence controlling circuitry 120 of the fourth embodiment. As illustrated in FIG. 16, the sequence controlling circuitry 120, for example, performs the preliminary scan that collects the entire k-space at PIF=1 (full sampling) and thereafter performs the imaging scan that collects the entire k-space at PIF=2. In this situation, the sequence controlling circuitry 120 performs this preliminary scan by the same pulse sequence as the imaging scan and with the gradient magnetic field for phase encoding Ge applied. The image generating circuitry 136 then generates the phase difference map using the echo signals collected by the preliminary scan.

Figure 17:
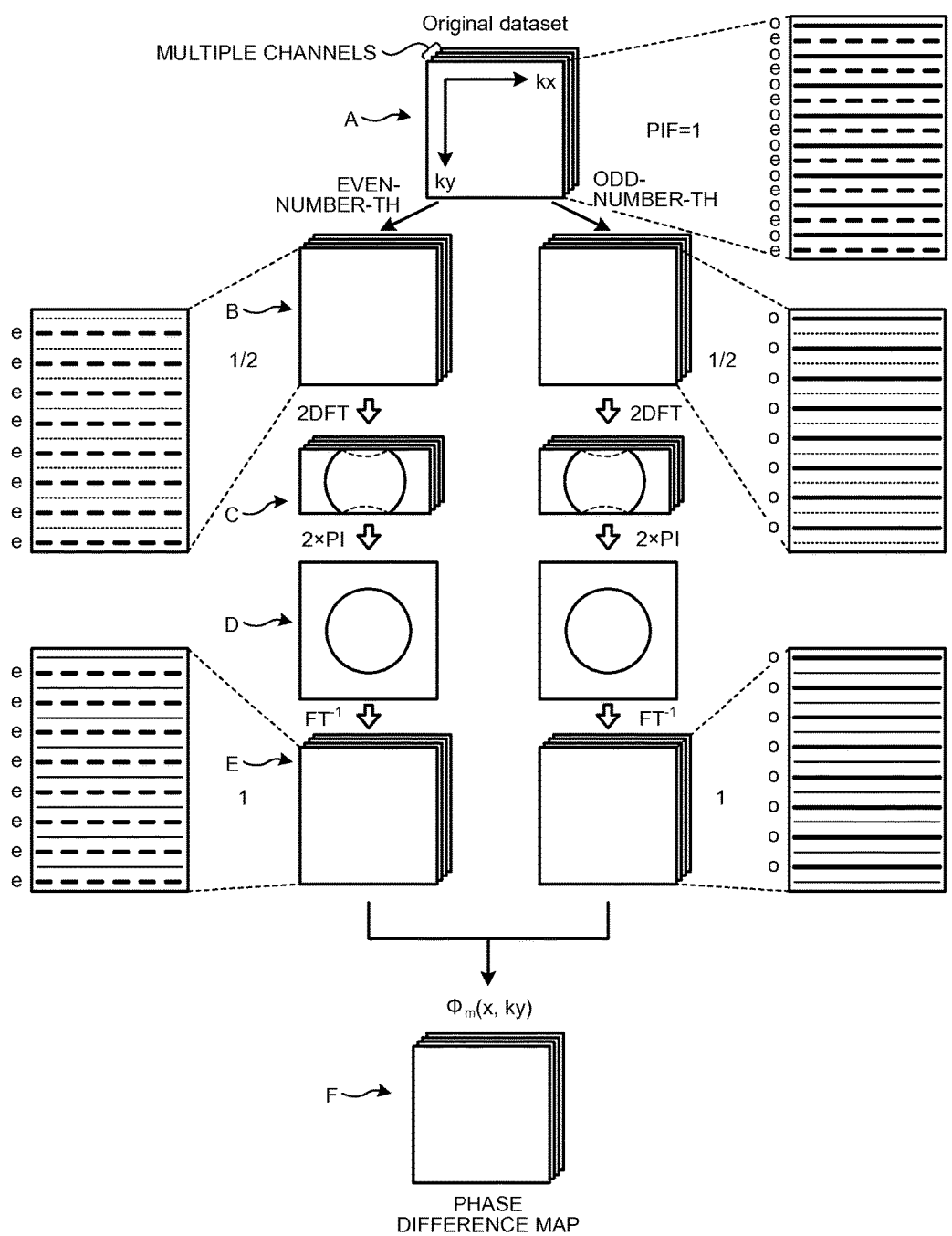
FIG. 17 is a diagram for illustrating processing performed by image generating circuitry according to the fourth embodiment.

FIG. 17 is a diagram for illustrating processing performed by the image generating circuitry 136 of the fourth embodiment. The processing of the fourth embodiment is different from the processing of the modification of the second embodiment illustrated in FIG. 11 in that "Original dataset" is the k-space data arranged at PIF=1 as illustrated in A in FIG. 17. In the fourth embodiment, the phase difference map is generated by the preliminary scan, which is different from the imaging scan, and PIF of the preliminary scan can be set to higher density than PIF of the imaging scan.

Specifically, as illustrated in B in FIG. 17, the image generating circuitry 136 separately extracts the even-number-th line group and the odd-number-th line group from the pieces of k-space data of the respective channels. In this case, the k-space data is arranged with one phase encode line decimated with respect to two phase encode lines. Next, as illustrated in C in FIG. 17, the image generating circuitry 136 performs reconstruction on the respective pieces of k-space data from which the even-number-th line group and the odd-number-th line group have been extracted to generate folded images. Next, as illustrated in D in FIG. 17, the image generating circuitry 136 performs unfolding processing equivalent to PIF=2, thereby obtaining unfolded images. As illustrated in E in FIG. 17, the image generating circuitry 136 obtains the k-space data corresponding to the even-number-th image and the k-space data corresponding to the odd-number-th image by inverse reconstruction. Next, the image generating circuitry 136 performs one-dimensional Fourier transform in the kx direction separately on the respective pieces of k-space data obtained by inverse reconstruction. The image generating circuitry 136 makes a comparison within the same phase encode lines on the ky-x space, thereby generating a two-dimensional phase difference map $\phi m(x,ky)$ for the multiple channels as illustrated in F in FIG. 17.

As described above, the image generating circuitry 136 according to the fourth embodiment applies the phase difference map obtained from the preliminary scan for the echo signals collected by the imaging scan. However, when the preliminary scan is performed at PIF=1, and the imaging scan is performed at PIF=2, for example, it is considered that a difference in collection time occurs between both scans. Therefore, when the phase difference map is applied, the application range of the phase difference map is desirably adjusted so as to absorb the difference in collection time.

Figure 18A:
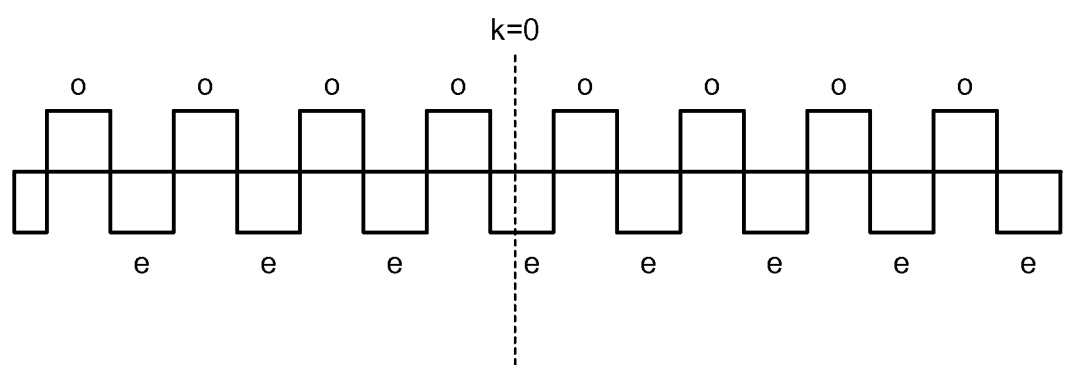
FIGS. 18A and 18B are diagrams for illustrating adjustment of an application range of a phase difference map in the fourth embodiment.
Figure 18B:
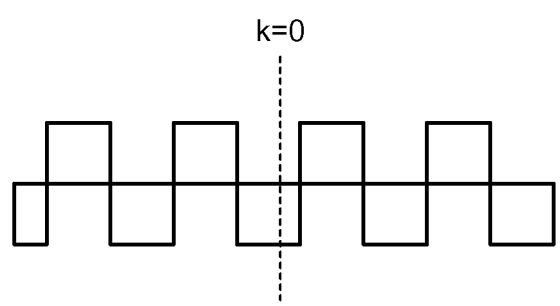

FIGS. 18 and 19 are diagrams for illustrating adjustment of the application range of the phase difference map in the fourth embodiment. For example, A in FIG. 18 illustrates a scan performed at PIF=1, whereas B in FIG. 18 illustrates a scan performed at PIF=2. The scan performed at PIF=2 thus has a shorter collection time than that of the scan performed at PIF=1, and as illustrated in FIG. 18, the timing at which the central part ("k=0" in FIG. 18) of the k-space deviates between both scans. On condition that the influence of the non-uniformity of the static magnetic field or the like gradually increases as time passes, when a phase of an echo signal is corrected, even correction using the phase correction values of the same phase encode line of the phase difference map may fail to be appropriate correction. Instead, correction using temporally corresponding phase correction values can be appropriate correction. Given this situation, in the fourth embodiment, the image generating circuitry 136 adjusts the application range of the phase difference map so as to absorb the difference in collection time present between both scans.

The image generating circuitry 136 can adjust this application range in accordance with the type of the pulse sequence for use in the scan. When the pulse sequence for use in the preliminary scan or the imaging scan is an SE-system pulse sequence, as illustrated in A in FIG. 19, the image generating circuitry 136, for example, performs phase correction using only information at the central part in the phase difference map. This is because in the case of an EPI pulse sequence that is a SE-system, it is considered that phase dispersion of the collected echo signals proceeds symmetrically from the center of the k-space, and it can be considered that a range in which the collection times overlap between the preliminary scan and the imaging scan is a certain range (about ½, for example) of the central part. In the case of an FE-system pulse sequence, as illustrated in B in FIG. 19, the image generating circuitry 136, for example, performs phase correction using only information at the upper half (or the lower half) collected first in the phase difference map. This is because in the case of the FE-system pulse sequence, it is considered that phase dispersion of the collected echo signals proceeds in the order of time of data collection, that is, proceeds in the order that data is arranged from an end of the k-space, and it can be considered that a range in which the collection times overlap between the preliminary scan and the imaging scan is a certain range (about ½, for example) of the upper half (or the lower half) in accordance with the order that the echo signals are arranged.

When only partial phase correction values are used, the image generating circuitry 136, for example, can apply an average value of the partial phase correction values as phase correction values for use in conversion of the rest of the echo signals. The image generating circuitry 136, for example, can estimate, from the partial phase correction values, the rest of the phase correction values, by line fitting (linear or higher-order) and can apply the estimated phase correction values for the conversion of the rest of the echo signals. In the case of A in FIG. 19, for example, the image generating circuitry 136 estimates the phase correction values of the peripheral part based on the phase correction values of the certain range in the central part in the phase difference map by line fitting. In the case of B in FIG. 19, for example, the image generating circuitry 136 estimates the phase correction values of the remaining half based on the phase correction values in the certain range of the upper half (or the lower half) in the phase difference map by line fitting.

Figure 20:
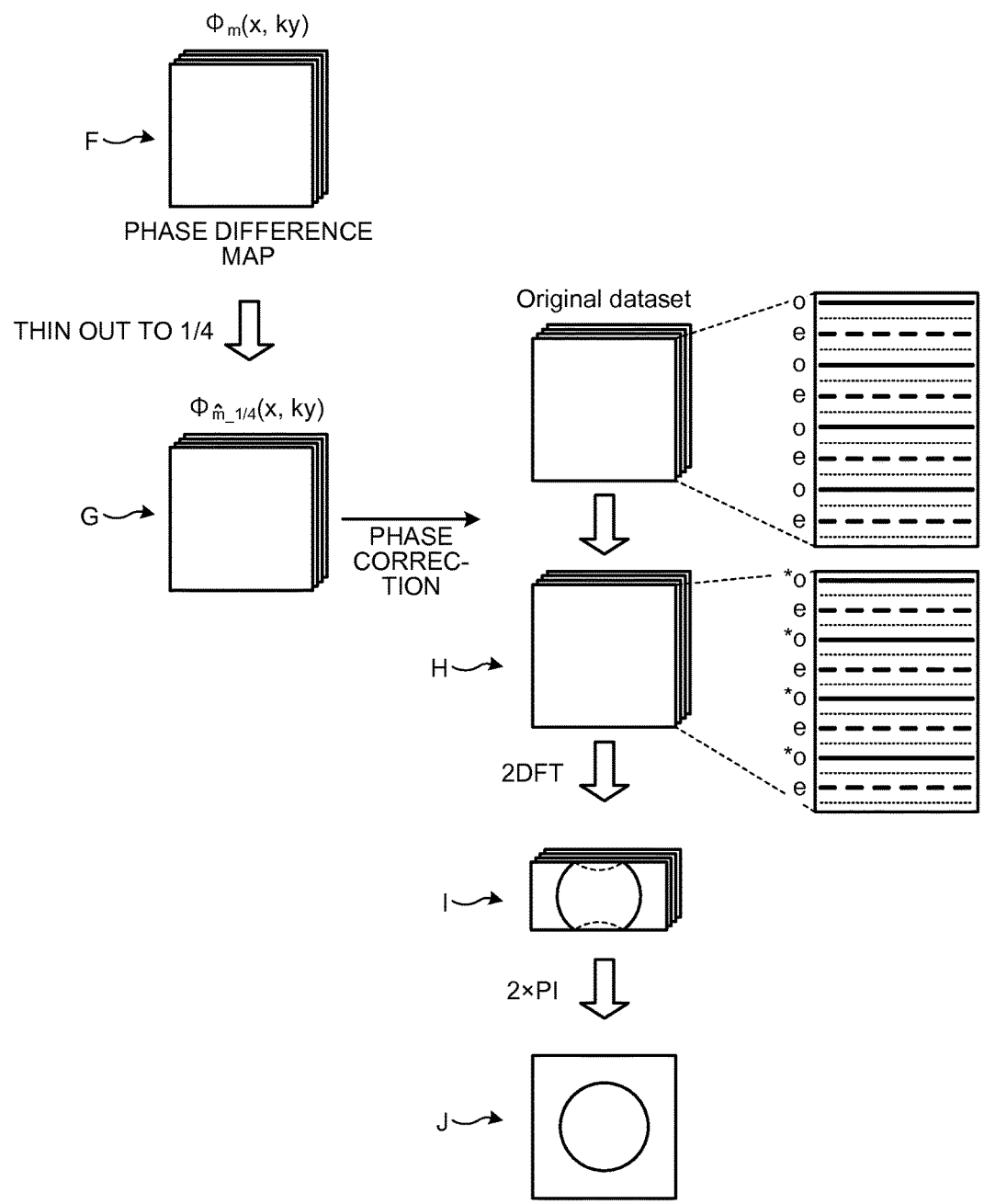

FIG. 20 is a diagram for illustrating the processing performed by the image generating circuitry 136 according to the fourth embodiment. As illustrated in G in FIG. 20, for the phase difference map $\phi_m(x,ky)$, the image generating circuitry 136, for example, decimates the central ½ range thereof further by ½, thereby decimating to ¼ as a whole (low resolution map) and applies the decimated range to phase correction. The phase difference map after decimation is represented as $\phi_{m\_1/4}(x,ky)$. The image generating circuitry 136 applies the decimated phase difference map while supplementing necessary phase correction values by estimation or the like, thereby obtaining the pieces of k-space data in which the phases of the respective echo signals match as illustrated in H in FIG. 20 (Equation (8)).

$$\tilde{S}(x, ky) = S(x, ky) \cdot \exp(-i \cdot \Phi_{m\_1/4}(x, ky)) \qquad (8)$$

$\begin{pmatrix} S(x, ky)\text{: Echo signal before phase correction} \\ \tilde{S}(x, ky)\text{: Echo signal after phase correction} \end{pmatrix}$ Thereafter, similarly to the above-described embodiments, as illustrated in I in FIG. 20, the image generating circuitry 136 performs reconstruction on the respective pieces of k-space data to obtain folded images, and then as illustrated in J in FIG. 20, performs unfolding processing equivalent to PIF=2, thereby obtaining an unfolded image. The adjustment of the application range of the phase difference map is merely an example. In accordance with the difference in collection time caused by the difference in PIF between the preliminary scan and the imaging scan or the type of the pulse sequence, the application range can be changed as appropriate.

Although FIG. 20 describes a case of performing the processing without dividing "Original dataset" into the even-number-th line group and the odd-number-th line group, examples are not limited to this. Similarly to the embodiment described in FIG. 8 or the like, the even-number-th line group and the odd-number-th line group may separately be extracted from "Original dataset." The image generating circuitry 136 may combine the two images generated thereafter.

In FIG. 20, the phase difference map $\phi_{m\_1/4}(x,ky)$ generated using the even-number-th lines as a standard is assumed. Thus, the phase-corrected lines are represented by the phase-corrected odd-number-th line "*o". However, embodiments are not limited to this. When the phase difference map $\phi_{m\_1/4}(x,ky)$ generated using the odd-number-th lines as a standard is assumed, for example, the phase-corrected lines are represented by the phase-corrected even-number-th lines "*e". When the phase difference map $\phi_{m\_1/4}(x,ky)$ generated in order to match with another value that is neither the even-number-th lines nor the odd-number-th lines, for example, the phase-corrected lines are represented by the phase-corrected odd-number-th lines "*o" and the phase-corrected even-number-th lines "*e".

Modification of Fourth Embodiment

Figure 21:
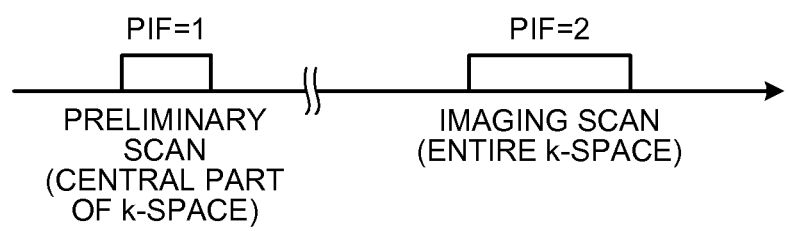
FIG. 21 is a diagram for illustrating processing performed by sequence controlling circuitry according to a modification of the fourth embodiment.

FIG. 21 is a diagram for illustrating processing performed by the sequence controlling circuitry 120 according to a modification of the fourth embodiment. The preliminary scan is not limited to a case in which the entire k-space is collected at PIF=1 (full sampling), and as illustrated in FIG. 21, only the central part of the k-space may be collected at PIF=1, for example. In this case, as described in the modification of the third embodiment, the image generating circuitry 136 generates the phase difference map from the echo signals at this central part of the k-space. The image generating circuitry 136 then applies this phase difference map to image processing on the echo signals collected by the imaging scan.

Furthermore, although the fourth embodiment describes an example of generating the phase difference map from the echo signals collected by the preliminary scan, embodiments are not limited to this. For example, similarly to the processes described in the second embodiment and the third embodiment, a process may be employed in which the phase correction values may be determined for each line and applied as appropriate, not in the form of the phase difference map Although the fourth embodiment and the modification thereof describe an example of collecting the echo signals for use in the derivation of the phase correction values at PIF=1 (full sampling), embodiments are not limited to these. The echo signals for use in the derivation of the phase correction values are collected with higher density (at a lower decimation rate) than PIF of the imaging scan.

Other Embodiments

Embodiments are not limited to the above-described embodiments.

(Phase Correction in Ky Direction)

Although the above-described embodiments describe a process that corrects the phase deviation (the position deviation on the time axis that is of the type (A) and the phase deviation at a peak time that is of the type (B)) in the kx direction as phase correction, the image generating circuitry 136 may further correct phase deviation in the ky direction. The image generating circuitry 136 according to the embodiments, for example, performs one-dimensional Fourier transform on the k-space data as complex data in the ky direction. The image generating circuitry 136 then uses the real component and the imaginary component to determine phase change values in the y direction at a j-th line of frequency encode step. The image generating circuitry 136 calculates the arctangent of the ratio of $I_{im(even)}$ (y,j) to $I_{re(even)}$ (y,j), thereby calculating the phase change values $\theta(y,j)$ in the y direction at the j-th line of frequency encode step. The image generating circuitry 136, for example, calculates the phase change values in the ky direction for each of the pieces of data arranged near the central part of the k-space and derives the phase correction values so that the calculated respective phase change values match. The image generating circuitry 136 performs phase correction using the derived phase corrosion values. With this process, not only the phase deviation in the kx direction is corrected, but also the phase deviation in the ky direction is corrected together. Consequently, image quality is further improved.

The third embodiment, for example, describes an example of collecting the central part of the k-space by full sampling. The fourth embodiment describes an example of performing the collection by the scan different from the imaging scan. The image generating circuitry 136, for example, calculates the phase change values in the ky direction from the k-space data thus collected and arranged in the k-space. The image generating circuitry 136 performs the phase correction in the ky direction.

(Phase Correction on Ky-Kx Space)

The second embodiments and thereafter describe a process that performs the phase correction on both the position deviation on the time axis that is of the type (A) and the phase deviation at a peak time that is of the type (B), on the ky-x space. The ky-x space is a k-space obtained by performing one-dimensional Fourier transform on the ky-kx space in the kx direction. However, embodiments are not limited to these. The image generating circuitry 136, for example, may perform the phase correction regarding the (A) and the (B) on the ky-kx space.

In this case, the image generating circuitry 136, for example, searches for a peak of the echo signal for each phase encode line on the ky-kx space. When the image generating circuitry 136 searches for the peak on each phase encode line, the image generating circuitry 136 shifts the phase encode line in the kx direction so that the peak is matched with the ky axis. The image generating circuitry 136 performs this shift processing for all phase encode lines, thereby correcting the position deviation on the time axis that is of the type (A) for all phase encode lines. Next, the image generating circuitry 136, for the echo signal of the peak of each phase encode line, rotates the phase so that the value of the echo signal has only the real component on a complex plane, thereby correcting the phase deviation at a peak time that is of the type (B) for all phase encode lines. The order of the pieces of processing may be inverted. In other words, the image generating circuitry 136, after the peak is searched for on each phase encode line, may first correct the phase deviation at a peak time that is of the type (B) and then correct the position deviation on the time axis that is of the type (A).

(Inverse Reconstruction by Performing One-Dimensional Inverse Fourier Transform in Ky Direction)

Although the second and following embodiments describes a process that obtains the k-space data equivalent to full sampling by inverse reconstruction by two-dimensional inverse Fourier transform, embodiments are not limited to these. The image generating circuitry 136, for example, may obtain the k-space data on the ky-x space by performing one-dimensional inverse Fourier transform on the even-number-th image and the odd-number-th image in the ky direction. In this case, the image generating circuitry 136 can proceed the processing by omitting the processing that performs one-dimensional Fourier transform in the kx direction described in the second and following embodiments.

(Timing for Arranging k-Space Data)

Although the above-described embodiments describe a case in which the echo signals collected by the sequence controlling circuitry 120 are arranged in the k-space as they are and the pieces of k-space data as illustrated are stored in the storage 132, embodiments are not limited to these. Specifically, in the embodiments, it is sufficient if only the echo signals necessary for the processing are arranged in the k-space at the timing at which the processing is performed by the image generating circuitry 136. In the third embodiment, for example, the processing performed by the image generating circuitry 136 may be started as long as the echo signals at the central part are collected first. The sequence controlling circuitry 120, for example, may first of all collect the echo signals at the central part of the k-space and then collect the residual echo signals. In this case, the image generating circuitry 136, for example, may go on with image generation processing concurrently with the collection processing performed by the sequence controlling circuitry 120. As a result, time from the starting of imaging to the outputting of image is shortened.

(Generation and Display of Various Images)

Although the above-described embodiments describe examples of outputting the combined image of the odd-number-th image and the even-number-th image and outputting the odd-number-th image and the even-number-th image separately, embodiments are not limited to these. The image generating circuitry 136 can generate at least one image among the even-number-th image, the odd-number-th image, and a combined image or a difference image of these and display the generated image on the display 135. The difference image is an image generated by subtracting one image from the other image, among the odd-number-th image and the even-number-th image. Typically, the odd-number-th image is subtracted from the even-number-th image. However, embodiments are not limited to this.

The image generating circuitry 136, for example, may generate all or part of the even-number-th image, the odd-number-th image, the combined image, and the difference image and may display all the generated images on the display 135 next to each other. Alternatively, the image generating circuitry may display part of the images or successively in a certain order, in accordance with the selection by an operator. The image generating circuitry 136, for example, may generate only an image designated in advance from the even-number-th image, the odd-number-th image, the combined image, and the difference image. This designation may be, for example, done by receiving input from the operator at an imaging planning stage or an image generating stage after the imaging scan. Alternatively, the designation may be done in advance in preset information of imaging conditions. The preset information of imaging conditions is information in which combinations of initial values of various parameters included in the pulse sequence are prepared in advance and provided to the operator, for each imaging region and imaging purposes. The operator selects the preset information provided by the MRI apparatus 100 and may perform imaging using the selected preset information as is selected. Alternatively the operator may perform imaging after further modifying the preset information. When it is set in advance that generating what image is appropriate for the imaging region of interest or the imaging purpose, as a piece of such present information, for example, the operator can easily generate and display an appropriate image only by selecting the preset information.

Figure 22A:
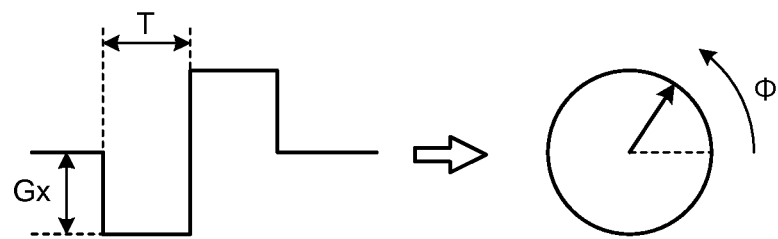
FIG. 22A and FIG. 22B are diagrams for illustrating various images in an embodiment.
Figure 22B:
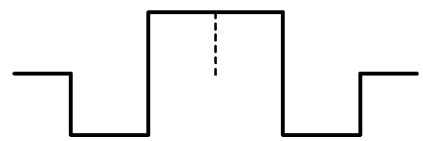

The following describes characteristics that the respective various images such as the even-number-th image, the odd-number-th image, the combined image, and the difference image have. FIG. 22A and FIG. 22B are diagrams for illustrating the various images in an embodiment. When a polarity-inverted dipolar gradient magnetic field of the same area is applied as in EPI, as illustrated in FIG. 22A, the phase $\Phi$ of a nuclear spin (hereinafter, a spin) changes by a value proportional to a velocity component $v_x$ in the gradient magnetic field direction. This is represented by the following Equation (9), where $\gamma$ is a gyromagnetic ratio:

$$\Phi=(\gamma G_x T^2)v_x \tag{9}$$

Consider now a static spin and a moving spin. In the case of the static spin, the spin receives a magnetic field change of the same shape as the waveform of the gradient magnetic field, and the change in the phase $\Phi$ is cancelled out. In the case of the moving spin, the intensity of the magnetic field that the spin receives gradually changes, and the change in the phase $\Phi$ is not cancelled out. However, when a pulse with the inverted bipolar gradient magnetic field is applied, a phase change of $-\Phi$ occurs, and when a combined pulse is applied as illustrated in FIG. 22B, the change in the phase $\Phi$ is cancelled out even in the case of the moving spin.

When this phenomenon is considered in application to the pulse sequence of EPI of FIG. 2, in the odd-number-th collected echo signal group, for example, the change in the phase $\Phi$ appears, whereas in the even-number-th collected echo signal group, the change in the phase $\Phi$ does not appear. In this case, in the odd-number-th image, a fluid signal is dark, whereas a static part signal is bright, and in the even-number-th image, both the fluid signal and the static part signal are bright. In addition, in this case, when the image generating circuitry 136 generates the difference image in which the odd-number-th image is subtracted from the even-number-th image, the static part signal is subtracted, and an image in which only the fluid signal is brightly represented is generated. The image generating circuitry 136 generates the difference image, thereby extracting only the velocity component $v_x$.

A method for utilizing the odd-number-th image and the even-number-th image is not limited to the above-described example. Consider, for example, a case in which the odd-number-th echo signal group is collected at timing at which water and fat are in opposite phase with each other and the even-number-th echo signal group is collected at timing at which they are in the same phase. In this case, for example, when the image generating circuitry 136 generates an image in which the odd-number-th image and the even-number-th image are added, an image of water alone is generated, and when a difference image is generated, an image of fat alone is generated.

(Specific Numerical Values and Order of Processing)

The specific numerical values and the order of processing exemplified in the above-described embodiments are in principle merely examples. For example, PIF, the number of channels, the direction of decimation, the size of the k-space, and the like can all be arbitrarily changed. The order of processing can also be arbitrarily changed; for example, pieces of processing that can be performed concurrently may be performed concurrently. For example, although the above-described embodiments describe the processing of reconstruction by two-dimensional Fourier transform or the like and the unfolding processing by the PI method separately, embodiments are not limited to these. On condition that the same result is obtained as a whole, some processing procedures may be reordered or concurrently performed. Although the above-described embodiments describe the SENSE system as the PI method as an example, embodiments are not limited to these, and the SMASH system (GRAPPA, for example) can also be used as the PI method. Although EPI is described as an example of the pulse sequence, embodiments are not limited to this, and also in other pulse sequences such as fast spin echo (FSE), the above-described embodiments can also be applied similarly.

(Image Processing System)

Although the above-described embodiments describe a case in which the MRI apparatus 100 as a medical image diagnostic apparatus performs the various pieces of processing, embodiments are not limited to these. For example, an image processing system including the MRI apparatus 100 and an image processing apparatus may perform the above-described various pieces of processing. The image processing apparatus is, for example, a workstation, an image storage apparatus (an image server) or a viewer of a picture archiving and communication system (PACS), various apparatuses of an electronic medical recording system, or the like. In this case, the MRI apparatus 100, for example, performs collection by the sequence controlling circuitry 120. The image processing apparatus receives the MR data and the k-space data collected by the MRI apparatus 100 from the MRI apparatus 100 or from the image server through a network or receives the pieces of data input from the operator through a storage medium or the like and stores the pieces of data in the storage. The image processing apparatus may perform the above-described various pieces of processing (the processing performed by the arranging circuitry 133a and the processing performed by the image generating circuitry 136, for example) on the MR data and the k-space data stored in the storage.

(Computer Program)

Instructions described in the processing procedures in the above-described embodiments can be executed based on a computer program as software. A general-purpose computer stores therein this computer program in advance and reads this computer program, thereby enabling the same effect as the effect by the MRI apparatus 100 of the above-described embodiments. The instructions described in the above-described embodiments are recorded as a computer program that can be executed by a computer in a storage medium such as a magnetic disk (a flexible disk, a hard disk, or the like), an optical disc (a CD-ROM, a CD-R, a CD-RW, a DVD-ROM, a DVD±R, a DVD±RW, or the like), a semiconductor memory, or storage media of a similar kind. So long as the computer or an incorporated system can read the storage medium, a storage format thereof may be in any form. The computer reads the computer program from the storage medium and causes a CPU to execute the instructions described in the computer program based on the computer program, thereby achieving operation similar to that of the MRI apparatus 100 of the above-described embodiments. When the computer acquires or reads the computer program, the acquisition or reading may be performed through a network.

Part of the respective pieces of processing for achieving the above-described embodiments may be performed by an operating system (OS) operating on the computer based on the computer program installed in the computer or the incorporated system from the storage medium, database managing software, middleware (MW) such as a network, or the like. Furthermore, the storage medium is not necessarily a medium independent of the computer or the incorporated system and includes a storage medium that downloads a computer program transmitted through a local area network (LAN), the Internet, or the like and store or temporarily stores therein the downloaded computer program. The storage medium is not limited to one, and a case in which the pieces of processing in the above-described embodiments are performed from a plurality of media is also included in the storage medium in the embodiments. The configuration of the medium may be any configuration.

The computer or the incorporated system in the embodiments are for performing the respective pieces of processing in the above-described embodiments based on the computer program stored in the storage medium and may be any configuration such as a single apparatus such as a personal computer and a microcomputer and a system in which a plurality of apparatuses are network-connected. The computer in the embodiments includes, not only a personal computer, but also arithmetic processing circuitry and a microcomputer included in an information processing apparatus. The computer in the embodiments is a generic term referring to equipment and apparatuses that can implement the pieces of functionality by the computer program.

The magnetic resonance imaging apparatus of at least one embodiment described above increases image quality under high-speed imaging condition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   sequence controlling circuitry configured to
   continuously apply, after application of an excitation pulse, a readout gradient magnetic field while inverting polarity to control execution of a pulse sequence that continuously generates multiple echo signals and
   collect echo signals for multiple channels by parallel imaging; and
   image generating circuitry configured to
   extract at least one of an even-number-th collected echo signal group and an odd-number-th collected echo signal group from multiple echo signals continuously collected,
   generate at least one of an even-number-th image and an odd-number-th image using the extracted echo signal group for the multiple channels and sensitivity distribution for the multiple channels, and
   perform inverse Fourier transform on at least one of the even-number-th image and the odd-number-th image to generate at least one of high-density k-space data corresponding to the even-number-th image and high-density k-space data corresponding to the odd-number-th image, and
   generate an image based on the generated high-density k-space data.

2. The magnetic resonance imaging apparatus according to claim 1, wherein the image generating circuitry is further configured to
   perform inverse Fourier transform on the even-number-th image and the odd-number-th image to generate high-density k-space data corresponding to the even-number-th image and high-density k-space data corresponding to the odd-number-th image, compare echo signals included in respective pieces of k-space data within same encode lines to derive phase correction values that match phases of even-number-th collected echo signals with phases of odd-number-th collected echo signals, and generate the image based on the derived phase correction values.

3. The magnetic resonance imaging apparatus according to claim 2, wherein the image generating circuitry is configured to derive the phase correction values on a k-space that is after performing one-dimensional Fourier transform on a frequency encode axis.

4. The magnetic resonance imaging apparatus according to claim 2, wherein when echo signals for multiple channels are collected by parallel imaging, and the sequence controlling circuitry is configured to collect a central part of the k-space with high density, and
collect a peripheral part of the k-space with low density, and the image generating circuitry is configured to extract the even-number-th collected echo signal group and the odd-number-th collected echo signal group from the multiple echo signals continuously collected with respect to the central part and generate the even-number-th image and the odd-number-th image using the extracted echo signal groups and the sensitivity distribution for the multiple channels.

5. The magnetic resonance imaging apparatus according to claim 2, wherein the image generating circuitry is configured to generate a phase difference map that corresponds to an entirety of encode lines and that accumulates the phase correction values, and generate the image using the generated phase difference map.

6. The magnetic resonance imaging apparatus according to claim 2, wherein the sequence controlling circuitry is configured to separately control execution of a first pulse sequence by a first parallel imaging factor and execution of a second pulse sequence by a second parallel imaging factor that is different from the first parallel imaging factor, and collect echo signals for multiple channels separately, and the image generating circuitry is configured to derive the phase correction values from echo signals collected by the execution of the first pulse sequence, and generate the image using the derived phase correction values and echo signals collected by the execution of the second pulse sequence.

7. The magnetic resonance imaging apparatus according to claim 6, wherein the first parallel imaging factor has a smaller decimation rate than the second parallel imaging factor.

8. The magnetic resonance imaging apparatus according to claim 2, wherein the high-density k-space data corresponding to the even-number-th image or the high-density k-space data corresponding to the odd-number-th image data are full sampling k-space data in which data are arranged without decimating any phase encode line.

9. The magnetic resonance imaging apparatus according to claim 1, wherein the image generating circuitry is configured to generate at least one image among the even-number-th image, the odd-number-th image, a combined image of the even-number-th image and the odd-number-th image, and a difference image of the even-number-th image and the odd-number-th image and display the generated image on a display.

10. The magnetic resonance imaging apparatus according to claim 1, wherein the image generating circuitry is configured to generate an image designated from the even-number-th image, the odd-number-th image, a combined image of the even-number-th image and the odd-number-th image, and a difference image of the even-number-th image and the odd-number-th image, in preset information of imaging conditions and display the generated image on a display.

11. A magnetic resonance imaging apparatus comprising:

sequence controlling circuitry configured to continuously apply a readout gradient magnetic field, after application of an excitation pulse, while decimating phase encode direction and while inverting polarity of the readout gradient magnetic field, to continuously collect multiple echo signals; and image generating circuitry configured to extract an even-number-th collected echo signal group and an odd-number-th collected echo signal group from the multiple echo signals continuously collected;

generate an even-number-th image and an odd-number-th image using the even-number-th collected echo signal group and the odd-number-th collected echo signal group, and generate an image in which phase correction has been performed, based on a phase difference map generated based on the even-number-th image and the odd-number-th image.

12. An image processing apparatus comprising image generating circuitry configured to generate an even-number-th image based on an even-number-th collected echo signal group and generate an odd-number-th image based on an odd-number-th collected echo signal group, the even-number-th collected echo signal group and the odd-number-th collected echo signal group being extracted from multiple echo signals, the multiple echo signals collected by executing an EPI (Echo Planar Imaging) pulse sequence while decimating phase encode direction, and generate an image in which phase correction has been performed, based on a phase difference map generated based on the even-number-th image and the odd-number-th image.

* * * * *